United States Patent
Danial et al.

(10) Patent No.: US 11,431,347 B2
(45) Date of Patent: Aug. 30, 2022

(54) ANALOG-TO-DIGITAL CONVERTER USING A PIPELINED MEMRISTIVE NEURAL NETWORK

(71) Applicant: TECHNION RESEARCH & DEVELOPMENT FOUNDATION LIMITED, Haifa (IL)

(72) Inventors: Loai Danial, Nazareth (IL); Shahar Kvatinsky, Hanaton (IL)

(73) Assignee: TECHNION RESEARCH & DEVELOPMENT FOUNDATION LIMITED, Haifa (IL)

( * ) Notice: Subject to any disclaimer, the term of this patent is extended or adjusted under 35 U.S.C. 154(b) by 0 days.

(21) Appl. No.: 17/116,144

(22) Filed: Dec. 9, 2020

(65) Prior Publication Data
US 2021/0175893 A1    Jun. 10, 2021

Related U.S. Application Data

(60) Provisional application No. 62/957,854, filed on Jan. 7, 2020, provisional application No. 62/945,293, filed on Dec. 9, 2019.

(51) Int. Cl.
*H03M 1/18* (2006.01)
*H03M 1/26* (2006.01)
(Continued)

(52) U.S. Cl.
CPC .......... *H03M 1/181* (2013.01); *G06K 9/6256* (2013.01); *G06N 3/04* (2013.01); *G06N 3/063* (2013.01); *H03M 1/26* (2013.01); *H03M 1/44* (2013.01)

(58) Field of Classification Search
CPC .......... H03M 1/181; H03M 1/26; H03M 1/44; H03M 1/145; G06K 9/6256; G06N 3/04;
(Continued)

(56) References Cited

U.S. PATENT DOCUMENTS 5,424,736 A  *  6/1995  Stryjewski .............. H03M 1/42
                                              341/161
10,103,742 B1 * 10/2018  Guo ........................ H03M 1/68

OTHER PUBLICATIONS

M. Yip and A. P. Chandrakasan, "A Resolution-reconfigurable 5-to-10-bit 0.4-to-1 V power scalable SAR ADC for sensor applications," IEEE J. Solid-State Circuits, vol. 48, No. 6, pp. 1453-1464, Apr. 2013. http://dx.doi.org/10.1109/JSSC.2013.2254551.
(Continued)

*Primary Examiner* — Khai M Nguyen
(74) *Attorney, Agent, or Firm* — The Roy Gross Law Firm, LLC; Roy Gross

(57) ABSTRACT

A pipelined ADC system comprising: a first ADC stage comprising a trainable neural network layer and configured to receive an analog input signal, and convert it into a first n-bit digital output representing said analog input signal; a DAC circuit comprising a trainable neural network layer and configured to receive said first n-bit digital output, and convert it into an analog output signal representing said first n-bit digital output; and a second ADC stage comprising a trainable neural network layer and configured to receive a residue analog input signal of said analog input signal, and convert it into a second n-bit digital output representing said residue analog input signal; wherein said first and second n-bit digital outputs are combined to generate a combined digital output representing said analog input signal.

20 Claims, 17 Drawing Sheets

(51) Int. Cl.
  *G06N 3/063* (2006.01)
  *G06K 9/62* (2022.01)
  *G06N 3/04* (2006.01)
  *H03M 1/44* (2006.01)

(58) Field of Classification Search
  CPC ........ G06N 3/063; G06N 3/0635; G06N 3/08;
  G06V 10/82; G06V 10/95
  USPC .................................................. 341/155, 161
  See application file for complete search history.

(56) References Cited

OTHER PUBLICATIONS

R. Sarpeshkar, "Analog versus digital: Extrapolating from electronics to neurobiology," Neural Comput., vol. 10, No. 7, pp. 1601-1638, Oct. 1998 doi: 10.1162/089976698300017052.
A. K. Jain, Jianchang Mao and K. M. Mohiuddin, "Artificial neural networks: a tutorial," in Computer, vol. 29, No. 3, pp. 31-44, Mar. 1996, doi: 10.1109/2.485891.
T. Kugelstadt, "The operation of the SAR-ADC based on charge redistribution," Texas Instrum. Analog Appl. J., pp. 10-12, Feb. 2000.
C. Po-Rong, W. Bor-Chin, and H. M. Gong, "A Triangular connection hopfield neural network approach to analog-to-digital conversion," IEEE Trans. Instrum. Meas., vol. 43, No. 6, pp. 882-888, Dec. 1994. doi: 10.1109/19.368081.
D. Tank and J. J. Hopfield, "Simple 'neural' optimization networks: An A/D converter, signal decision circuit, and a linear programming circuit," IEEE Trans. Circuits Syst., vol. 33, No. 5, pp. 533-541, May 1986. doi: 10.1109/TCS.1986.1085953.
J. J. Hopfield, "Neurons with graded response have collective computational properties like those of two-state neurons," Proc. Nat. Acad. Sci. USA, vol. 81, No. 10, pp. 3088-3092, May 1984. https://doi.org/10.1073/pnas.81.10.3088.
Hopfield J. J. (1982). Neural networks and physical systems with emergent collective computational abilities. Proceedings of the National Academy of Sciences of the United States of America, 79(8), 2554-2558. https://doi.org/10.1073/pnas.79.8.2554.
B. W. Lee and B. J. Sheu, "Design of a neural-based A/D converter using modified Hopfield network," in IEEE Journal of Solid-State Circuits, vol. 24, No. 4, pp. 1129-1135, Aug. 1989, doi: 10.1109/4.34101.
Lee BW, Sheu BJ. Modified Hopfield neural networks for retrieving the optimal solution. IEEE Trans Neural Netw. 1991;2(1):137-42. doi: 10.1109/72.80300. PMID: 18276360.
Gao, Ligang & Merrikh-Bayat, Farnood & Alibart, Fabien & Xinjie, Guo & Hoskins, Brian & Cheng, Kwang-Ting & Strukov, Dmitri. (2013). Digital-to-analog and analog-to-digital conversion with metal oxide memristors for ultra-low power computing. Proceedings of the 2013 IEEE/ACM International Symposium on Nanoscale Architectures, Nanoarch 2013. 19-22. 10.1109/NanoArch.2013.6623031.
X. Guo et al., "Modeling and experimental demonstration of a hopfield network analog-to-digital converter with hybrid CMOS/memristor circuits," Frontiers Neurosci., vol. 9, pp. 1-8, Dec. 2015. doi: 10.3389/fnins.2015.00488.
A. Tankimanova, A. K. Maan and A. P. James, "Level-shifted neural encoded analog-to-digital converter," 2017 24th IEEE International Conference on Electronics, Circuits and Systems (ICECS), 2017, pp. 377-380, doi: 10.1109/ICECS.2017.8292026.
J. J. Hopfield and D.W. Tank, "Computing with neural circuits: a model," Science, vol. 233, No. 4764, pp. 625-633, Aug. 1986.
A. N. Michel and D. L. Gray, "Analysis and synthesis of neural networks with lower block triangular interconnecting structure," in IEEE Transactions on Circuits and Systems, vol. 37, No. 10, pp. 1267-1283, Oct. 1990, doi: 10.1109/31.103221.
G. Avitabile, M. Forti, S. Manetti, andM.Marini, "On a Class of nonsymmetrical neural networks with application to ADC," IEEE Trans. Circuits Syst, vol. 38, No. 2, pp. 202-209, Feb. 1991. doi: 10.1109/31.68298.
C. L. Sun, Z. Tang, O. Ishizuka and H. Matsumoto, "Synthesis and implementation of T-model neural-based A/D converter," 1992 IEEE International Symposium on Circuits and Systems (ISCAS), 1992, pp. 1573-1576 vol. 3, doi: 10.1109/ISCAS.1992.230197.
M. J. S. Smith and C. L. Portmann, "Practical design and analysis of a simple 'neural' optimization circuit," in IEEE Transactions on Circuits and Systems, vol. 36, No. 1, pp. 42-50, Jan. 1989, doi: 10.1109/31.16562.
V. Chande and P. G. Poonacha, "On neural networks for analog to digital conversion," in IEEE Transactions on Neural Networks, vol. 6, No. 5, pp. 1269-1274, Sep. 1995, doi: 10.1109/72.410371.
O. Ishizuka, Z. Tang, T. Inoue, H. Matsumoto and S. Ohba, "A T-model neural network with learning ability," [Proceedings] 1991 IEEE International Joint Conference on Neural Networks, 1991, pp. 2288-2293 vol.3, doi: 10.1109/IJCNN.1991.170729.
Zheng Tang, O. Ishizuka and H. Matsumoto, "Backpropagation learning in analog T-Model neural network hardware," Proceedings of 1993 International Conference on Neural Networks (IJCNN-93-Nagoya, Japan), 1993, pp. 899-902 701.1, doi: 10.1109/IJCNN.1993.714056.
B. Widrow and M. A. Lehr, "30 Years of adaptive neural networks: perceptron, madaline, and backpropagation," Proc. IEEE, vol. 78, No. 9, pp. 1415-1442, Sep. 1990.
B. Widrow and S. D. Stearns, "Adaptive signal processing," Englewood Cliffs, NJ, USA: Prentice-Hall, 1985.
Douglas, S.C. "Introduction to Adaptive Filters" Digital Signal Processing Handbook Ed. Vijay K. Madisetti and Douglas B. Williams Boca Raton: CRC Press LLC, 1999.
E. Rosenthal, S. Greshnikov, D. Soudry and S. Kvatinsky, "A fully analog memristor-based neural network with online gradient training," 2016 IEEE International Symposium on Circuits and Systems (ISCAS), 2016, pp. 1394-1397, doi: 10.1109/ISCAS.2016.7527510.
R. Douglas,M.Mahowald, and C. Mead, "Neuromorphic analogue VLSI," Ann. Rev. Neurosci., vol. 18, pp. 255-281, Mar. 1995.
M. A. C. Maher, S. P. Deweerth, M. A. Mahowald and C. A. Mead, "Implementing neural architectures using analog VLSI circuits," in IEEE Transactions on Circuits and Systems, vol. 36, No. 5, pp. 643-652, May 1989, doi: 10.1109/31.31311.
A. G. Andreou et al., "Current-mode subthreshold MOS circuits for analog VLSI neural systems," IEEE Trans. Neural Netw., vol. 2, No. 2, pp. 205-213, Mar. 1991.
W. Wang et al., "An adaptive neural network A/D converter based on CMOS/memristor hybrid design," IEICE Electron. Express, vol. 11, No. 24, Nov. 2014, Art. No. 20141012.
R. M. Gray, "Quantization noise spectra," IEEE Trans. Informat. Theory, vol. 36, No. 6, pp. 1220-1244, Nov. 1990.
Nemirovsky, Yael & Corcos, Dan & Brouk, Igor & Nemirovsky, Amikam & Chaudhry, Samir. (2011). 1/f noise in advanced CMOS transistors. Instrumentation & Measurement Magazine, IEEE. 14.14-22. 10.1109/MIM.2011.5704805.
O. M. Solomon, "The use of DFT windows in signal-to-noise ratio and harmonic distortion computations," 1993 IEEE Instrumentation and Measurement Technology Conference, 1993, pp. 103-108, doi: 10.1109/IMTC.1993.382671.
T. Dietterich, "Overfitting and undercomputing inmachine learning,"ACM Comput. Surveys, vol. 27, No. 3, pp. 326-327, Sep. 1995.
R. Naous, M. Al-Shedivat, and K. N. Salama, "Stochasticity modeling in memristors," IEEE Trans. Nanotechnol., vol. 15, No. 1, pp. 15-28, Jan. 2016. doi: 10.1109/TNANO.2015.2493960.
R. Benzi, A. Sutera, and A. Vulpiani, "The mechanism of stochastic resonance," J. Phys. A, Math. General, vol. 14, No. 11, pp. L453-L457, Nov. 1981. https://iopscience.iop.org/article/10.1088/0305-4470/14/11/006/meta.
Stotland A, Di Ventra M. Stochastic memory: memory enhancement due to noise. Phys Rev E Stat Nonlin Soft Matter Phys. Jan. 2012;85(1 Pt 1):011116. doi: 10.1103/PhysRevE.85.011116. Epub Jan. 10, 2012. PMID: 22400521.

(56) References Cited

OTHER PUBLICATIONS

P. Kakoty, "Design of a high frequency low voltage CMOS operational amplifier," Int. J. VLSI Design Commun. Syst., vol. 2, No. 1, pp. 73-85, Mar. 2011. DOI:10.5121/VLSIC.2011.2107.

S. B. Mashhadi and R. Lotfi, "Analysis and design of a low-voltage lowpower double-tail comparator," IEEE Trans. Very Large Scale Integr. Syst., vol. 22, No. 2, pp. 343-352, Feb. 2014. doi: 10.1109/TVLSI.2013.2241799.

Wong, H. S. P., Lee, H. Y., Yu, S., Chen, Y. S., Wu, Y., Chen, P. S., Lee, B., Chen, F. T., & Tsai, M. J. (2012). Metal-oxide RRAM. Proceedings of the IEEE, 100(6), 1951-1970. [6193402]. https://doi.org/10.1109/JPROC.2012.2190369.

R. J. van de Plassche, CMOS Integrated Analog-to-Digital and Digital-to- Analog Converters. New York, NY, USA Springer, 2003.

L. Danial, N. Wainstein, S. Kraus and S. Kvatinsky, "Didactic: A Data-Intelligent Digital-to-Analog Converter with a Trainable Integrated Circuit using Memristors," in IEEE Journal on Emerging and Selected Topics in Circuits and Systems, vol. 8, No. 1, pp. 146-158, Mar. 2018, doi: 10.1109/JETCAS.2017.2780251.

Chiu, Y., Nikolić, B., & Gray, P.R. (2005). Scaling of analog-to-digital converters into ultra-deep-submicron CMOS. Proceedings of the IEEE 2005 Custom Integrated Circuits Conference, 2005., 375-382. doi: 10.1109/CICC.2005.1 568684.

L. Danial, N. Wainstein, S. Kraus and S. Kvatinsky, "Breaking Through the Speed-Power-Accuracy Tradeoff in ADCs Using a Memristive Neuromorphic Architecture," IEEE Transactions on Emerging Topics in Computational Intelligence, vol. 2, No. 5, pp. 396-409, Oct. 2018; doi 10.1109/TETCI.2018.2849109.

Neftci, Emre. (2018). Data and Power Efficient Intelligence with Neuromorphic Learning Machines. iScience. 5. 10.1016/j.isci.2018.06.010.

Tankimanova, Aigerim & James, A.. (2018). Neural Network-Based Analog-to-Digital Converters. 10.5772/intechopen.73038. Retrieved from: http://www.intechopen.com/books/memristor-and-memristiveneural-networks; http://dx.doi.org/10.5772/intechopen.73038.

L. Danial, K. Sharma, and S. Kvatinsky, "A Pipelined Memristive Neural Network Analog-to-Digital Converter", Proceedings of the IEEE International Symposium on Circuits and Systems (ISCAS), May 2020. doi: 10.1109/ISCAS45731.2020.9181108.

L. Danial, K. Sharma, S. Dwivedi, and S. Kvatinsky, "Logarithmic Neural Network Data Converters using Memristors for Biomedical Applications", Accepted to Proceedings of the IEEE Biomedical Circuits and Systems (BioCAS), Oct. 2019. doi: 10.1109/BIOCAS.2019.8919068.

L. Chua, "Memristor—The missing circuit element,"IEEE Transactions on Circuit Theory, vol. 18, No. 5, pp. 507-519, Sep. 1971; doi: 10.1109/TCT.1971.1083337.

Strukov DB, Snider GS, Stewart DR, Williams RS. The missing memristor found. Nature. May 1, 2008;453(7191):80-3. doi: 10.1038/nature06932. Erratum in: Nature. Jun. 25, 2009;459(7250):1154. PMID: 18451858.

Matthew D. Pickett, Dmitri B. Strukov, Julien L. Borghetti, J. Joshua Yang, Gregory S. Snider, Duncan R. Stewart, and R. Stanley Williams , "Switching dynamics in titanium dioxide memristive devices", Journal of Applied Physics 106, 074508 (2009) https://doi.org/10.1063/1.3236506.

Yang, J. J., Pickett, M. D., Li, X., Ohlberg, D. A., Stewart, D. R., & Williams, R. S. (2008). Memristive switching mechanism for metal/oxide/metal nanodevices. Nature nanotechnology, 3(7), 429-433. https://doi.org/10.1038/nnano.2008.160.

S. Kvatinsky, M. Ramadan, E. G. Friedman and A. Kolodny, "VTEAM: A General Model for Voltage-Controlled Memristors," IEEE Transactions on Circuits and Systems II: Express Briefs, vol. 62, No. 8, pp. 786-790, Aug. 2015. doi: 10.1109/TCSII.2015.2433536.

J. Sandrini, B. Attarimashalkoubeh, E. Shahrabi, I. Krawczuk, and Y. Leblebici, "Effect of Metal Buffer Layer and Thermal Annealing on HfOx-based ReRAMs," 2016 IEEE International Conference on the Science of Electrical Engineering (ICSEE), pp. 1-5, Nov. 2016. doi: 10.1109/ICSEE.2016.7806101.

S. Choi, S. Ham and G. Wang (Mar. 29, 2019). Memristor Synapses for Neuromorphic Computing [Online First], IntechOpen, DOI: 10.5772/intechopen.85301. Available from: https://www.intechopen.com/online-first/memristor-synapses-for-neuromorphic-computing.

D. Soudry, D. Di Castro, A. Gal, A. Kolodny and S. Kvatinsky, "Memristor-Based Multilayer Neural Networks With Online Gradient Descent Training," IEEE Transactions on Neural Networks and Learning Systems, vol. 26, No. 10, pp. 2408-2421, Oct. 2015. doi: 10.1109/TNNLS.2014.2383395.

J. J. Sit and R. Sarpeshkar, "A Micropower Logarithmic A/D with Offset and Temperature Compensation," JSSC, vol. 39, No. 2, pp. 308-319, 2004. doi: 10.1109/JSSC.2003.821777.

J. Mahattanakul, "Logarithmic Data Converter Suitable for Hearing Aid Applications," IET, vol. 41, No. 7, pp. 394-396, Mar. 2005. DOI:10.1049/el:20057578.

Lee, J., Kang, J., Park, S., Seo, J. S., Anders, J., Guilherme, J., & Flynn, M. P. (2009). A 2.5 mW 80 dB DR 36 dB SNDR 22 MS/s logarithmic pipeline ADC. IEEE Journal of Solid-State Circuits, 44(10), 2755-2765. [18], https://doi.org/10.1109/JSSC.2009.2028052.

Lee, Jongwoo & Rhew, Hyo-Gyuem & Kipke, Daryl & Flynn, Michael. (2010). A 64 Channel Programmable Closed-Loop Neurostimulator With 8 Channel Neural Amplifier and Logarithmic ADC. Solid-State Circuits, IEEE Journal of. 45. 1935-1945. 10.1109/JSSC.2010.2052403.

H. Rhew et al., "A Fully Self-Contained Logarithmic Closed Loop Deep Brain Stimulation SoC with Wireless Telemetry and Wireless Power Management," JSSC, vol. 45, No. 10, 2014. doi: 10.1109/JSSC.2014.2346779.

Judy, M., Sodagar, A. M., Lotfi, R., & Sawan, M. (2013). Nonlinear signal-specific ADC for efficient neural recording in brain-machine interfaces. IEEE transactions on Biomedical Circuits and Systems, 8(3), 371-381. doi: 10.1109/TBCAS.2013.2270178.

Y. Sundarasaradula, T. G. Constandinou and A. Thanachayanont, "A 6-bit, two-step, successive approximation logarithmic ADC for biomedical applications," 2016 IEEE International Conference on Electronics, Circuits and Systems (ICECS), 2016, pp. 25-28, doi: 10.1109/ICECS.2016.7841123.

A. Thanachayanont, "A 1-V, 330-nW, 6-Bit Current-Mode Logarithmic Cyclic ADC for ISFET-Based pH Digital Readout System," CSSP, pp. 1405-1429, 2015. https://doi.org/10.1007/s00034-014-9908-0.

K Sharma, S Kvatinsky, SK Vishvakarma. Large-scale architectures of neuromorphic data converters. 2019. Discipline of Electrical Engineering, IIT Indore.

S. H. Lewis, "Optimizing the stage resolution in pipelined, multistage, analog-to-digital converters for video-rate applications," in IEEE Transactions on Circuits and Systems II: Analog and Digital Signal Processing, vol. 39, No. 8, pp. 516-523, Aug. 1992, doi: 10.1109/82.168943.

C. C. Lee and M. P. Flynn, "A SAR-Assisted Two-Stage Pipeline ADC," IEEE Journal of Solid-State Circuits, vol. 46, No. 4, pp. 859-869, Apr. 2011. doi: 10.1109/JSSC.2011.2108133.

N. N. Çikan and M. Aksoy, "Analog to Digital Converters Performance Evaluation Using Figure of Merits in Industrial Applications," 2016 European Modelling Symposium (EMS), 2016, pp. 205-209, doi: 10.1109/EMS.2016.043.

Danial, Loai & Kvatinsky, Shahar. (2018). Real-Time Trainable Data Converters for General Purpose Applications. 10.1145/3232195.3232209.

Aziza, Sassi & Dzahini, Daniel & gallin-martel, Laurent. (2015). A high speed high resolution readout with 14-bits area efficient SAR-ADC adapted for new generations of CMOS image sensors. 89-92. 10.1109/PRIME.2015.7251341.

A. Correia, P. Barquinha, J. Marques and J. Goes, "A High-resolution A-Modulator ADC with Oversampling and Noise-shaping for IoT," 2018 14th Conference on Ph.D. Research in Microelectronics and Electronics (PRIME), 2018, pp. 33-36, doi: 10.1109/PRIME.2018.8430338.

K. Garje, S. Kumar, A. Tripathi, G. Maruthi and M. Kumar, "A high CMRR, high resolution bio-ASIC for ECG signals," 2016 20th

(56) References Cited

OTHER PUBLICATIONS

International Symposium on VLSI Design and Test (VDAT), 2016, pp. 1-2, doi: 10.1109/SVDAT.2016.8064890.
D. R. Beck, D. J. Allstot and D. Garrity, "An 8-bit, 1.8 V, 20 MSample/s analog-to-digital converter using low gain opamps," Proceedings of the 2003 International Symposium on Circuits and Systems, 2003. ISCAS '03., 2003, pp. I-I, doi: 10.1109/ISCAS.2003.1205698.
P. Harpe, A. Baschirotto and K. A. A. Makinwa, "High-Performance AD and DA Converters, IC Design in Scaled Technologies, and Time-Domain Signal Processing." Springer, 2014.
C.-J. Tseng, C.-F. Lai and H.-S. Chen, "A 6-Bit 1 GS/s Pipeline ADC Using Incomplete Settling With Background Sampling-Point Calibration," in IEEE Transactions on Circuits and Systems I: Regular Papers, vol. 61, No. 10, pp. 2805-2815, Oct. 2014, doi: 10.1109/TCSL2014.2333672.
L. Danial, S. Thomas, and S. Kvatinsky, "Delta-Sigma Modulation Neurons for High-Precision Training of Memristive Synapses in Deep Neural Networks", IEEE International Symposium on Circuits and Systems (ISCAS), May 2019; doi 10.1109/ISCAS.2019.8702621.
M. Steyaert and K. Uyttenhove, "Speed-power-accuracy trade-off in highspeed analog-to-digital converters: now and in the future . . . " in Analog Circuit Design. New York, NY, USA: Springer, Apr. 2000, pp. 3-24.
R. H. Walden, "Analog-to-digital converter survey and analysis," in IEEE Journal on Selected Areas in Communications, vol. 17, No. 4, pp. 539-550, Apr. 1999, doi: 10.1109/49.761034.
P. Kinget and M. Steyaert, "Impact of transistor mismatch on the speed-accuracy-power trade-off of analog CMOS circuits," Proceedings of Custom Integrated Circuits Conference, 1996, pp. 333-336, doi: 10.1109/CICC.1996.510569.
B. E. Jonsson, "A survey of A/D-converter performance evolution," in Proc. IEEE Int. Conf. Electron., Circuits Syst., Dec. 2010, pp. 766-769. doi: 10.1109/ICECS.2010.5724625.
C. Mead, "Neuromorphic electronic systems," in Proceedings of the IEEE, vol. 78, No. 10, pp. 1629-1636, Oct. 1990, doi: 10.1109/5.58356.
Jo SH, Chang T, Ebong I, Bhadviya BB, Mazumder P, Lu W. Nanoscale memristor device as synapse in neuromorphic systems. Nano Lett. Apr. 14, 2010;10(4):1297-301. doi: 10.1021/nl904092h. PMID: 20192230.
G. Indiveri, B. Linares-Barranco, R. Legenstein, G. Deligeorgis, and T. Prodromakis, "Integration of nanoscale memristor synapses in neuromorphic computing architectures," Nanotechnology., vol. 24, No. 38, Sep. 2013, Art. No. 384010.
Prezioso M, Merrikh-Bayat F, Hoskins BD, Adam GC, Likharev KK, Strukov DB. Training and operation of an integrated neuromorphic network based on metal-oxide memristors. Nature. May 7, 2015;521(7550):61-4. doi: 10.1038/nature14441. PMID: 25951284.
B. J. Hosticka, "Performance comparison of analog and digital circuits," Proc. IEEE, vol. 73, No. 1, pp. 25-29, Jan. 1985.
Murmann, B. (2008). A/D converter trends: Power dissipation, scaling and digitally assisted architectures. Proceedings of the Custom Integrated Circuits Conference. 105-112. 10.1109/CICC.2008 4672032.
B. Murmann, "ADC Performance Survey 1997-2017," [Online], Available: http://web.stanford.edu/~murmann/adcsurvey.html.
K. Uyttenhove and M. S. J. Steyaert, "Speed-power-accuracy tradeoff in high-speed CMOS ADCs," in IEEE Transactions on Circuits and Systems II: Analog and Digital Signal Processing, vol. 49, No. 4, pp. 280-287, Apr. 2002, doi: 10.1109/TCSII.2002.801191.
Li, J., & Moon, U. K. (2003). Background calibration techniques for multistage pipelined ADCs with digital redundancy. IEEE Transactions on Circuits and Systems II: Analog and Digital Signal Processing, 50(9), 531-538. doi: 10.1109/TCSII.2003.816921.
Bin Le, T. W. Rondeau, J. H. Reed and C. W. Bostian, "Analog-to-digital converters," in IEEE Signal Processing Magazine, vol. 22, No. 6, pp. 69-77, Nov. 2005, doi: 10.1109/MSP.2005.1550190.
P. Nuzzo, F. De Bernardinis, P. Terreni, and G. Van der Plas, "Noise analysis of regenerative comparators for reconfigurable ADC architectures," IEEE Trans. Circuits Syst. I, Reg. Papers, vol. 55, No. 6, pp. 1441-1454, Jul. 2008.

\* cited by examiner

ANALOG-TO-DIGITAL CONVERTER USING A PIPELINED MEMRISTIVE NEURAL NETWORK

CROSS-REFERENCE TO RELATED APPLICATIONS

This application claims the benefit of priority of U.S. Provisional Patent Application Nos. 62/945,293, filed on Dec. 9, 2019 and 62/957,854, filed on Jan. 7, 2020. The contents of the above applications are all incorporated by reference as if fully set forth herein in their entirety.

BACKGROUND OF THE INVENTION

This invention relates to the field of an analog to digital converters (ADC) using memristors in a neural network.

High performance data converters are key components in modern mixed-signal systems, in advanced technology nodes, and emerging data-driven applications. However, the analog performance in the same process is dramatically degraded due to reduced signal-to-noise ratio (SNR), low intrinsic gain, device leakage, and device mismatch. These deep-submicron effects exacerbate the intrinsic speed-power-accuracy tradeoff in ADCs, which has become a chronic bottleneck of modern system design. Moreover, these effects are poorly handled with specific and time-consuming design techniques for special purpose applications, resulting in considerable overhead and severely degrading their performance.

The foregoing examples of the related art and limitations related therewith are intended to be illustrative and not exclusive. Other limitations of the related art will become apparent to those of skill in the art upon a reading of the specification and a study of the figures.

SUMMARY OF THE INVENTION

The following embodiments and aspects thereof are described and illustrated in conjunction with systems, tools and methods which are meant to be exemplary and illustrative, not limiting in scope.

There is provided, in an embodiment, a pipelined analog-to-digital converter (ADC) system comprising: a first ADC stage comprising a trainable neural network layer, wherein said first ADC stage is configured to (i) receive an analog input signal, and (ii) convert it into a first n-bit digital output representing said analog input signal; a digital-to-analog converter (DAC) circuit comprising a trainable neural network layer, wherein said DAC circuit is configured to (iii) receive said first n-bit digital output, and (iv) convert it into an analog output signal representing said first n-bit digital output; and a second ADC stage comprising a trainable neural network layer, wherein said second ADC stage is configured to (v) receive a residue analog input signal of said analog input signal, and (vi) convert it into a second n-bit digital output representing said residue analog input signal; wherein said first and second n-bit digital outputs are combined to generate a combined digital output representing said analog input signal.

In some embodiments, the system further comprises one or more subsequent ADC stages connected in a pipelined arrangement, wherein each of said subsequent ADC stages comprises: a DAC circuit comprising a trainable neural network layer, wherein said DAC circuit is configured to receive an n-bit digital output from a preceding ADC stage and convert it into an analog output signal representing said n-bit digital output; and an ADC circuit comprising a trainable neural network layer, wherein said ADC circuit is configured to receive a residue analog input signal of said analog input signal, and convert it into an n-bit digital output representing said residue analog input signal.

There is also provided, in an embodiment, an analog to digital (ADC) conversion method, the method comprising: receiving an analog input signal; converting said analog input signal, using a first ADC stage comprising a trainable neural network layer, into a first n-bit digital output representing said analog input signal; converting said first n-bit digital output, using a digital-to-analog converter (DAC) circuit comprising a trainable neural network layer, into an analog output signal representing said first n-bit digital output; and converting a residue analog input signal of said analog input signal, using a second ADC stage comprising a trainable neural network layer, into a second n-bit digital output representing said residue signal; and combining said first and second n-bit digital outputs to generate a combined digital output representing said analog input signal.

In some embodiments, the method further comprises using one or more subsequent ADC stages connected in a pipelined arrangement, wherein said method comprises, with respect to each of said subsequent ADC stages: (i) receiving, from a preceding ADC stage, an n-bit digital output; (ii) converting said n-bit digital output, using a DAC circuit comprising a trainable neural network layer, into an analog output signal representing said n-bit digital output; and (iii) converting a residue analog input signal of said analog input signal, using an ADC circuit comprising a trainable neural network layer, into an n-bit digital output representing said residue signal.

In some embodiments, each of the first and second n-bit digital outputs is a 4-bit digital output.

In some embodiments, the residue analog input signal is determined based, at least in part, on a comparison between said analog input signal and said analog output signal.

In some embodiments, the first n-bit digital output, said second n-bit digital output, and all of said n-bit digital output of said subsequent ADC stages, are combined to generate said combined digital output.

In some embodiments, the combined digital output comprises a number of bits equal to n-bits multiplied by the number of all of said ADC stages.

In some embodiments, the first n-bit digital output represents a most significant bits (MSB) portion of said combined digital output.

In some embodiments, the n-bit digital output of a last of said subsequent ADC stages in the pipeline represents a least significant bits (LSB) portion of said combined digital output.

In some embodiments, each of the trainable neural network layers comprises a plurality of neurons connected with synapses, and wherein each of said synapses is set with an adjustable weighting.

In some embodiments, each of the synapses comprises a memristor, and wherein each of said trainable neural network layers is arranged as a memristive crossbar array comprising a synaptic weightings matrix.

In some embodiments, an output vector of each of the trainable neural network layers is calculated as a weighted sum of said outputs of said neurons multiplied by said synaptic weightings matrix.

In some embodiments, at a training stage, each of the neural network layers is trained by an iterative process comprising: (i) comparing said output vector of said neural network layer to a respective training input; and (ii) adjusting, based on said comparing, said synaptic weightings matrix of said neural network layer, wherein said adjusting minimizes a cost function based on a gradient descent algorithm.

In some embodiments, with respect to each of the ADC stages, the training input comprises an n-bit portion of a desired digital output of said system, and wherein said n-bit portion corresponds to bit positions of said n-bit digital output of said ADC stage within said combined digital output.

In some embodiments, with respect to each of the DAC circuits, the training input comprises an output of a preceding trained ADC stage.

In some embodiments, the training stage is performed simultaneously and independently with respect to all of said ADC stages.

In addition to the exemplary aspects and embodiments described above, further aspects and embodiments will become apparent by reference to the figures and by study of the following detailed description.

BRIEF DESCRIPTION OF THE FIGURES

Exemplary embodiments are illustrated in referenced figures Dimensions of components and features shown in the figures are generally chosen for convenience and clarity of presentation and are not necessarily shown to scale. The figures are listed below.

DETAILED DESCRIPTION OF THE INVENTION

Figure 1A:
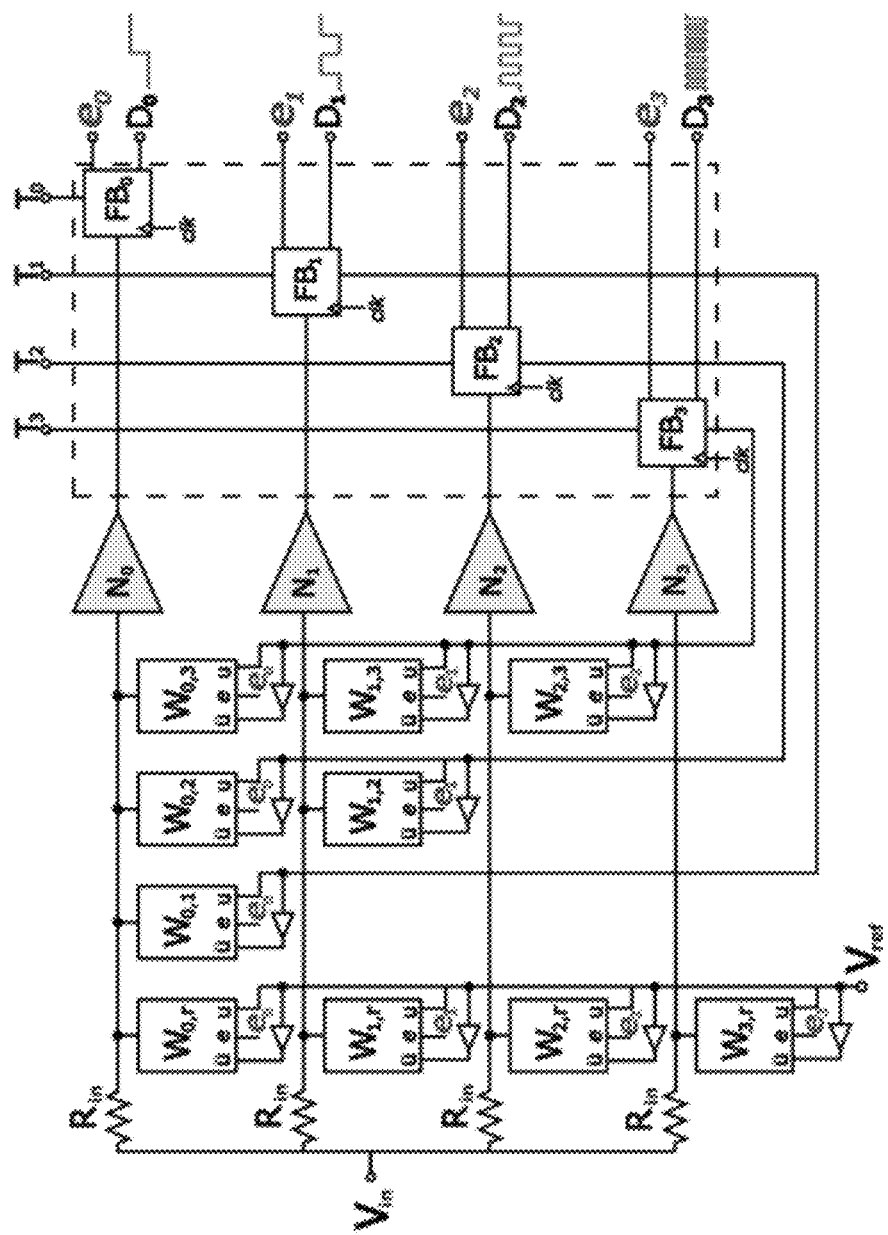
FIG. 1A shows a neural network-based 4-bit ADC architecture.

Disclosed herein are a system and method providing for a neuromorphic analog-to-digital converter (ADC).

In some embodiments, the present design employs a pipelined neural network ADC architecture. In some embodiments, the present design provides for a large-scale ADC based on coarse-resolution neuromorphic ADC and DAC, modularly cascaded in a high-throughput pipeline, which are then trained using a training algorithm for multiple full-scale voltages and sampling frequencies. In some embodiments, the training algorithm may be configured to tune the neural network in non-ideal test conditions, as an accurate, fast, and low-power ADC.

In some embodiments, an ADC of the present disclosure comprises a hybrid CMOS-memristor design may achieve 0.97 fJ/conv figure-of-merit (FOM) at the maximum conversion rate.

As noted above, deep-submicron effects in current ADCs exacerbate the intrinsic speed-power-accuracy tradeoff. For example, current designs may achieve high resolution combined with moderate-to-high speeds, but they rely on proper component matching and require complex op-amps which are increasingly difficult to design and scale in state-of-the-art CMOS technologies. Additionally, they typically employ flash-type sub-ADCs, which require high power and have a large physical footprint, due to a large number of accurate comparators, pushing them out of the application band of interest.

The analog-to-digital conversion task can be characterized as an example of simple pattern recognition, where the analog input can be classified into one of the 2N different patterns for N bits, and thus can be readily solved using artificial neural networks (ANNs). The calibration and training process of these networks can be viewed as modification of neural parameters based on the measured error calculated during learning.

Four-bit single-stage neural network (NN) ADCs have been previously proposed. However, four-bit resolution is insufficient for practical applications, while direct scaling of this architecture is challenging due to the quadratic increase in number of synaptic weights (with exponentially large values), large footprint, high power consumption, longer training time, and limited sampling frequency.

Accordingly, in some embodiments, the present disclosure provides for a large-scale, general-purpose neuromorphic ADC. In some embodiments, the present ADC comprises a hybrid CMOS-memristor design with multiple trainable cores of four-bit NN ADCs and DACs in a two-stage pipeline. This architecture takes advantage of lightweight low-power sub-ADC cores combined with high throughput and resolution achievable through the pipeline. Furthermore, each sub-ADC optimizes the effective number of bits (ENOB) and power dissipation during training for the chosen sampling frequency.

In some embodiments, the present disclosure employs neuro-inspired approaches to create ADCs that could be trained in real time for general purpose applications, and break through conventional ADC limitations.

In some embodiments, the present disclosure leverages neural network architectures and artificial intelligence learning algorithms, to create an ADC which integrates memristor technology with CMOS.

In some embodiments, a learning algorithm of the present disclosure implements one or more supervised machine learning algorithms, e.g., a stochastic gradient descent algorithm, which fits multiple application specifications such as full-scale voltage ranges and sampling frequencies.

In some embodiments, the present disclosure provides for using the converted signal to train a neural network of the present ADC, in order to autonomously adapt to the exact specifications of the running application as well as to adjust to environmental variations.

In some embodiments, the present disclosure utilizes an artificial neural network (ANN) architecture comprising memristors. Memristors are two-terminal passive devices with varying resistance which changes according to the current flowing through the device, or alternatively, the voltage across the device. Memristors primarily serve as non-volatile memory and can be used for both digital and analog applications. The activation-dependent dynamics of memristors make them a promising feature for registering and updating synaptic weights. Consequently, memristors are now being widely adopted in the design of synapses for artificial neural systems because of their small footprint, analog storage properties, energy efficiency, and non-volatility. These characteristics allow for synapse-like behavior, where the conductance of the memristor is considered as the weight of the synapse. Accordingly, in some embodiments, the use of memristors as synapses helps to achieve a high-precision, high-speed, low-power, simple, cost-efficient, and reconfigurable single channel ADC architecture that improves on the typical speed-power accuracy tradeoff.

Although embodiments of the present disclosure will be detailed herein with reference to specific components and/or architectures, the present invention is not necessarily limited in its application to the details of construction and the arrangement of the components and/or methods set forth in the following description and/or illustrated herein.

BACKGROUND

While the analog domain is mainly characterized by its energy efficiency in data processing, its digital counterpart outperforms it in reliable computation. ADCs are mixed-signal systems that inherently combine hybrid analog-digital principles along with the pros and cons of each domain. Therefore, these systems are optimally customized to fit a specific subset from a wide functional spectrum.

Design tradeoff is an extreme case when the system is pushed toward its performance limits. The ADC comprises a signal sampler that discretely samples the continuous-time signal at a constant rate, and a quantizer that converts the sampled value to the corresponding discrete-time N-bit resolution binary-coded form. The quality of a system is considered ideal when it achieves high speed and accuracy with a low power drain. In practice, however, the resolution decreases as the conversion rate increases, and greater power consumption is required to achieve the same resolution.

Device mismatch is the dominant factor affecting system accuracy. Larger devices are necessary to improve system accuracy, but the capacitive loading of the circuit nodes increases as a result and greater power is required to attain a certain speed. The maximal speed of the system is a function of the gain-bandwidth, but it is limited by the input pole.

Aside from device mismatches, four loss mechanisms affect the ADC resolution and limit the signal-to-noise-and-distortion ratio (SNDR):

Quantization noise,
jitter,
comparator ambiguity, and
thermal noise.

Quantization noise is the only error in an ideal ADC. Jitter is a sample-to-sample variation of the instant in time at which sampling occurred. Additionally, the conversion speed is limited by the ability of the comparator to make assertive decisions regarding the relative amplitude of the input voltage. This limitation is called comparator ambiguity and it is related to the speed of the device used to fabricate the ADC. Device speed is measured as the frequency, $f_T$, at which there is unity current gain. As a result of these limitations, approximately one bit of resolution is lost each time the sampling rate doubles.

Whereas non-linear distortions, memory effects, and device mismatches can be somewhat compensated for, thermal white noise cannot; consequently, it is one of the more dominant limiters of ADC performance. It is modeled by KT/C noise, where K denotes Boltzmann's constant, T denotes temperature, and C denotes sampler capacitance. Lowering the noise floor by a factor of two in purely thermal-noise limited circuits would quadruple the power consumption. The limit that device mismatch imposes on the power consumption is approximately two orders of magnitude higher than the limit imposed by thermal noise.

The need to digitize so many signal types has produced a broad range of data converters diverse in their resolution, sampling rates, and power consumption budget. These considerations profoundly affect system architectures and their performance. The speed-power-accuracy tradeoff has resulted in a wide range of ADC architectures optimized for special purpose applications, from high-speed, to high-resolution, to low-power applications.

ADC Figure-of-Merit (FOM)

When comparing ADCs with different specifications, a numerical quantity known as a figure of merit (FOM) is used to characterize the performance of each ADC relative to its alternatives. Two or more metrics can be combined into a single FOM that accurately reflects the merits of the ADC in a certain context and for a specified purpose. One of the most widely used FOMs is defined as $$FOM = \frac{P}{2^{ENOB} \cdot f_s} \left[ \frac{J}{conv} \right],$$

and relates the ADC power dissipation during conversion, P, to its performance in terms of sampling frequency, fs, and effective number of resolution bits (ENOB).

Lower FOM values will result in better ADC performance. The ENOB is calculated from the SNDR as $$ENOB = \frac{SNDR(\text{dB}) - 1.76}{6.02}.$$

The aforementioned FOM best captures the fundamental speed-power-accuracy tradeoff. The ongoing saga of CMOS technology trends toward smaller transistor dimensions has resulted thus far in ultra-deep submicron transistors. The FOM evolution also best describes Moore's law of ADCs. Technology scaling improves sampling frequencies, because $f_T$ allows for faster operation. However, the speed of sampling frequency is limited by the comparator ambiguity. In the same context, the impact of technology scaling on power dissipation optimization is also limited by the supply voltages, and by leakage currents that inevitably lead to an increase in the power consumption required to maintain SNDR. These limitations, along with manufacturing process variations and device mismatches in ultra-deep submicron technologies, are the biggest obstacle to achieving high linearity, wide dynamic range, and high-resolution converters.

Trainable ADC for General Purpose Applications

Techniques for circumventing the tradeoff have recently been investigated, with the goal of achieving ultra-low-power consuming converters with high resolution through a combination of systematic, architectural and technological approaches. Examples of such methods are digitally assisted background calibration, time-interleaving, pipelining, sub-ranging, folding, interpolating, and oversampling. These techniques have succeeded to postpone the FOM saturation. Modern ADC architectures are custom designed circuits that are fine-tuned to optimize specific capabilities and design parameters up to the application's specification.

The field of machine learning (ML) is devoted to the study and implementation of systems capable of learning from data using their evolving perceptual ability to make crucial decisions, predictions, and classifications based on examples learned from the past. Data conversion could be viewed as a special case of the classification optimization and signal restoration problem that could easily be solved using ML to learn from the data.

Accordingly, a trainable ADC architecture for general purpose applications may be by a machine learning algorithm in real-time to optimize the ENOB and power dissipation, by providing a specific training dataset. This procedure is equivalent to a dynamic FOM optimization. The technique is not exclusive to reconfiguration, but can also be applied for device mismatch self-calibration, adaptation, and noise tolerance. Furthermore, the trainability of the architecture adds flexibility that makes it cost-effective and versatile, with a minimalistic design that uses one channel and an intelligent machine learning algorithm.

Neuromorphic Data Converters

Neuromorphic ADC

The deterministic four-bit neural network ADC in Danial (2018) converts an analog input voltage ($V_{in}$) to a digital output code ($D_3D_2D_1D_0$) according to the following iterative expressions, $$\begin{cases} D_3 = u(V_{in} - 8V_{ref}), \\ D_2 = u(V_{in} - 4V_{ref} - 8D_3), \\ D_1 = u(V_{in} - 2V_{ref} - 4D_2 - 8D_3), \\ D_0 = u(V_{in} - V_{ref} - 2D_1 - 4D_2 - 8D_3), \end{cases} \quad (1)$$

where Vref is the reference voltage equals to one full-scale voltage quantum (LSB), and u(·) is the signum neural activation function (neuron) having either zero or full-scale voltage output.

Figure 1B:
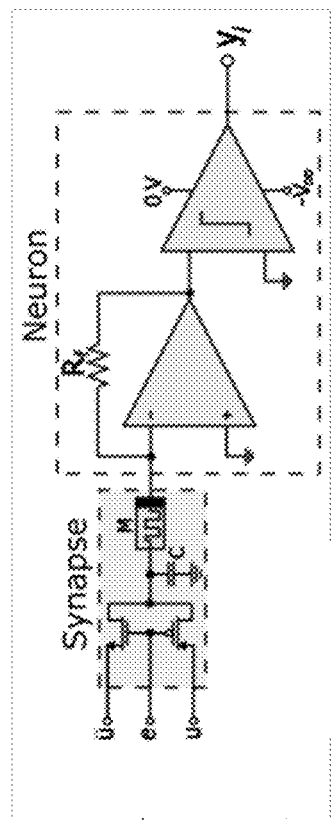
FIG. 1B shows a schematic memristive synapse connected to an artificial neuron implemented as an inverting opAmp for integration and a comparator for decision making.

The neural network shown in FIG. 1A implements Eq. (1) in hardware using reconfigurable synaptic weights ($W_{i,j}$—conductance between a pre-synaptic neuron with index j and a post-synaptic neuron with index i) to address their non-deterministic distribution in real-time operation and post-silicon fabrication. As shown in FIG. 1B, the synapses are realized using one NMOS, one PMOS and one memristor, with gates of the transistors connected to a common enable input e. When $e=V_{DD}$ ($-V_{DD}$), the NMOS (PMOS) switches on and u ($-\bar{u}$) is passed to the output. When e=0, both transistors are off and the output is zero. The neurons comprise of an inverting op-amp for integration and a latched comparator for decision making.

Synaptic weights are tuned to minimize the mean square error (MSE) by using the stochastic gradient descent (SGD) learning rule $$\Delta W_{ij(j>i)}^{(k)} = -\eta(T_i^{(k)} - D_i^{(k)})T_j^{(k)}, \quad (2)$$

where η is the learning rate (a small positive constant), and in each iteration k, the output of the network $D_i^{(k)}$ is compared to the desired teaching label $T_i^{(k)}$ that corresponds to the input $V_{in}^{(k)}$. The training continues until the training error falls to $E_{threshold}$, a predefined constant that defines the learning accuracy. The FOM is optimized and the network is configured from a random initial state to the desired ADC.

Neuromorphic DAC

Figure 1C:
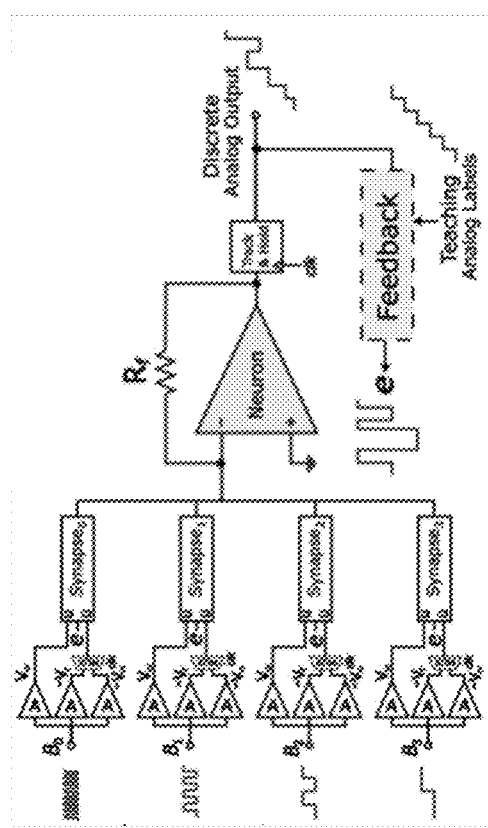
FIG. 1C shows a neural network-based 4-bit binary-weighted DAC architecture.

The neural network DAC in L. Danial et al., "DIDACTIC: A Data-Intelligent Digital-to-Analog Converter with a Trainable Integrated Circuit using Memristors," IEEE Journal on Emerging and Selected Topics in Circuits and Systems, Vol. 8, No. 1, pp. 146-158, March 2018, converts the four-bit digital input code ($V_3V_2V_1V_0$) to an analog output (A) as $$A = \frac{1}{2^4} \sum_{i=0}^{3} 2^i V_i, \quad (3)$$

where binary weights ($2^i$) are implemented with reconfigurable synaptic weights $W_i$ and having a similar realization as in FIG. 1B. As shown in FIG. 1C, the four synapses collectively integrate the input through the neuron (op-amp) to produce the output. This output is compared to the analog teaching labels in the pulse width modulation (PWM)-based feedback circuit, which regulates the value of the weights in real-time according to the time-varying gradient descent learning rule, $$\Delta W_i^{(k)} = -\eta(t)(V_{out}^{(k)} - t^{(k)})D_i^{(k)}, \quad (4)$$

where η(t) is the time-varying learning rate, and $t^{(k)}$ is the analog teaching label. The feedback is disconnected after the training is complete ($E < E_{threshold}$).

Scaling Challenges in Neuromorphic ADC

Increasing the scale of the neural network ADC beyond 4 bits is challenging. Table 1 below highlights the effect of scaling on design and performance parameters of the ADC.

TABLE 1

Scaling Challenges in Neuromorphic ADC

| Parameter | 4-bit | 8-bit | N-bit |
|---|---|---|---|
| # Neurons, feedbacks | 4 | 8 | N |
| # Synapses | 10 | 36 | N(N + 1)/2 |
| Total area (μm²) | 4850 | 9740 | N(1.1 N + 1250) |
| Conversion rate (GSPS) | 1.66 | 0.74 | 1/(N · $t_p$ + (N − 1)/BW) |
| Power (μW) | 100 | 650 | $P_{int} + P_{act} + P_{synapse}$ |

TABLE 1-continued

Scaling Challenges in Neuromorphic ADC

| Parameter | 4-bit | 8-bit | N-bit |
|---|---|---|---|
| FOM (fJ/conv) | 8.25 | 7.5 | $P/(2^{N-0.3} \cdot f_s)$ |
| HRS/LRS (memristor) | $2^4$ | $2^8$ | $2^{N-1+log2(Vdd/Vfs)}$ |
| # Levels (memristor) | 64 | 2048 | $N \cdot 2^N$ |

The number of synapses in the network increases quadratically. Consequently, the footprint and power consumption rise significantly. Moreover, there is an exponential rise in the aspect ratio of synaptic weights, which is practically limited by the high-to-low resistive states ratio (HRS/LRS), number of resistive levels, endurance of the memristor (e.g., multiple trainings per day for multiple days), and time and power consumption of the training phase—ultimately limiting the practical achievable resolution to four-bits. Additionally, higher number of neurons require longer conversion-time which limits the maximal Nyquist sampling frequency.

Neuromorphic Pipelined ADC

Neural Network Architecture

In some embodiments, the present disclosure provides for using coarse-resolution neural network-based ADCs and DACs, to create a fine-resolution pipelined network.

Figure 2A:
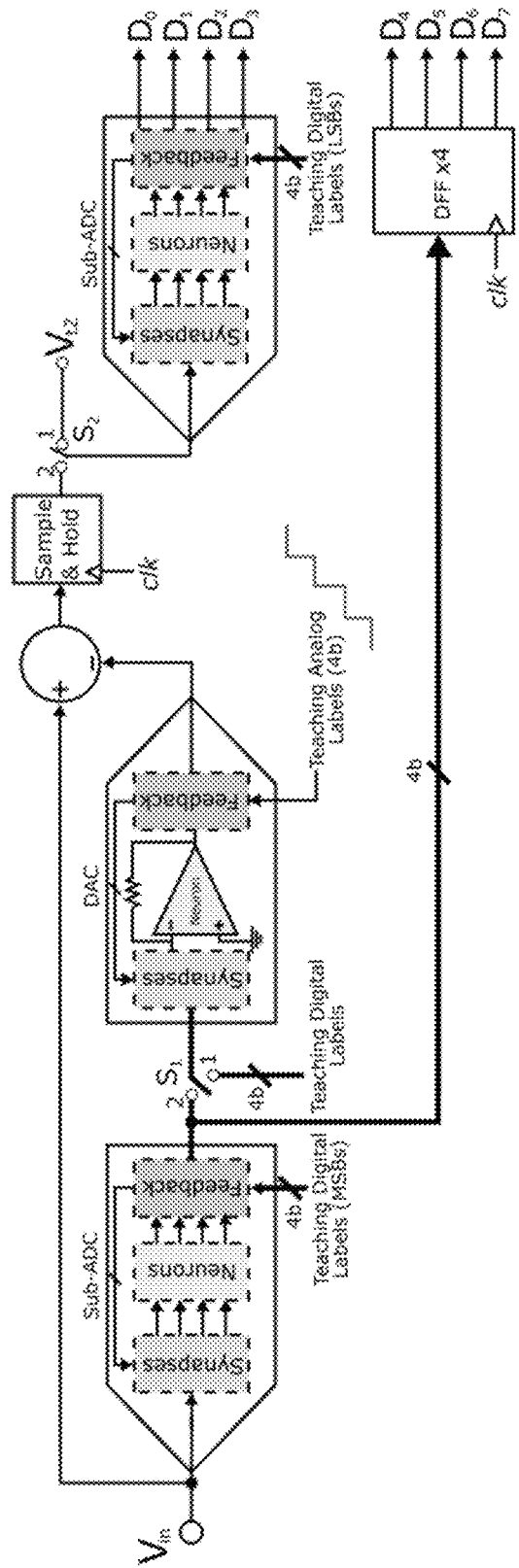
FIG. 2A shows an exemplary eight-bit two-stage pipelined ADC, according to an embodiment of the present invention.

FIG. 2A shows an exemplary eight-bit two-stage pipelined network, according to an embodiment of the present invention. In the first-stage sub-ADC, a synapse $W_{ij}$ is present between a pre-synaptic neuron with index j and output $D_j$, and a post-synaptic neuron with index i and digital output $D_i$. A neuron for each bit collectively integrates inputs from all synapses and produces an output by the signum neural activation function $u(\cdot)$. The sub-ADC coarsely quantizes the sampled input $V_{in}$ to the digital code $D_7 D_6 D_5 D_4$ as $$\begin{cases} D_7 = u(V_{in} - 8V_{ref}), \\ D_6 = u(V_{in} - 4V_{ref} - W_{6,7}D_7), \\ D_5 = u(V_{in} - 2V_{ref} - W_{5,6}D_6 - W_{5,7}D_7), \\ D_4 = u(V_{in} - V_{ref} - W_{4,5}D_5 - W_{4,6}D_6 - W_{4,7}D_7). \end{cases} \quad (5)$$

The output of the sub-ADC is converted back to an analog signal A by the DAC according to $$A = \frac{1}{2^4}\sum_{i=4}^{7} W_i D_i, \quad (6)$$

where $W_i$ are the synaptic weights. Next, this output is subtracted from the held input to produce a residue Q as $$Q = V_{in} - A. \quad (7)$$

This residue is sent to the next stage of the pipeline, where it is first sampled and held. The second stage sub-ADC is designed similarly to that of the first stage, except that the resistive weights of the input are modified from $R_{in}=R_f$ (feedback resistance of neuron) to $R_f/16$. This is made in order to scale the input from $V_{FS}/16$ to the full-scale voltage $V_{FS}$. The LSBs of the digital output are obtained from this stage as $$\begin{cases} D_3 = u(16Q - 8V_{ref}), \\ D_2 = u(16Q - 4V_{ref} - W_{2,3}D_3), \\ D_1 = u(16Q - 2V_{ref} - W_{1,2}D_2 - W_{1,3}D_3), \\ D_0 = u(16Q - V_{ref} - W_{0,1}D_1 - W_{0,2}D_2 - W_{0,3}D_3). \end{cases} \quad (8)$$

The sample-and-hold circuit enables concurrent operation of the two stages, achieving a high throughput rate, but introduces latency of two clock cycles. Thus D-flipflop registers are used to time-align the MSBs and the LSBs.

Conventional pipeline implementations generally use power-hungry flash sub-ADC cores and rely on redundancies and complex calibration techniques for high resolution. Conversely, in the present disclosure, trainable neural network ADC/DAC cores have minimalistic design with mismatch self-calibration, noise tolerance, and power consumption optimization. This eliminates the need for an exclusive inter-stage gain unit and calibration mechanism, because the residue is amplified by the input resistive weight of the second sub-ADC. Although resistors are highly prone to manufacturing variations, they can be effectively used as the input weights because their mismatches will be calibrated for by other memristive weights in the second stage. Furthermore, the training algorithm ensures that the quantization error remains within tolerable limits without using digital calibration techniques. This eliminates the area and power overheads of the calibration circuits, which overwhelm around 33% and 17% of the total area and power, respectively.

Training Framework

The aim of the training is to configure the network from a random initial state (random synaptic weights) to an accurate eight-bit ADC. It is achieved by minimizing the mean-square-error (MSE) of each sub-ADC and the DAC by using specific teaching labels for desired quantization. During the training phase, switches $S_1$ and $S_2$ are in position 1.

The DAC is supplied with four-bit digital teaching labels corresponding to an analog ramp input, as shown in FIG. 2(a). The binary-weighted time-varying gradient descent rule is used to minimize the MSE between the estimated and desired label. Learning parameters are listed in Table 2 below. The DAC is connected to the sub-ADC by switch $S_1$ when the error falls below $E_{threshold}$.

TABLE 2

Circuit Parameters

| Parameter | Value | Parameter | Value |
|---|---|---|---|
| Power supply | | Feedback resistor | |
| $V_{DD}$ | 1.8 V | $R_f$ | 45 kΩ |
| NMOS | | PMOS | |
| W/L | 10 | W/L | 20 |
| $V_{TN}$ | 0.56 V | $V_{TP}$ | −0.57 V |

TABLE 2-continued

Circuit Parameters

| Memristor | | | |
|---|---|---|---|
| $V_{on/off}$ | −0.3 V, | $R_{on/off}$ | 2 kΩ, |
| $K_{on/off}$ | 0.4 V | $α_{on/off}$ | 100 kΩ |
| | −4.8 μm/s, | | 3, 1 |
| | 2.8 μm/s | | |

| Reading voltage and time | | Writing voltage and time | |
|---|---|---|---|
| $V_r$ | −0.1125 V | $V_w$ | ±0.5 V |
| $T_r$ | 5 μs | $T_w$ | 5 μs |

| Learning parameters | | Sub-ADC/DAC parameters | |
|---|---|---|---|
| $η_{ADC/DAC}$ | 1, 1 | $f_s$ | 0.1 MSPS |
| $E_{threshold\ ADC/DAC}$ | $4.5 \cdot 10^{-2}$, | $V_{FS}$ | $V_{DD}$ |
| | $9 \cdot 10^{-3}$ | | |

The accuracy requirements of each stage decrease through the pipeline and the first stage should be accurate to the overall resolution. Moreover, the two-stages operate on different inputs for different quantization. Thus, their teaching dataset must be different to execute the online SGD algorithm as $$\Delta W_{ij(j>i)}^{(k)} = -η_{ADC}(T_i^{(k)}-D_i^{(k)})T_j^{(k)}, 0 \leq i,j \leq 3, \quad (9)$$

$$\Delta W_{ij(j>i)}^{(k)} = -η_{ADC}(T_i^{(k)}-D_i^{(k)})T_j^{(k)}, 4 \leq i,j \leq 7, \quad (10)$$

Figure 2B:
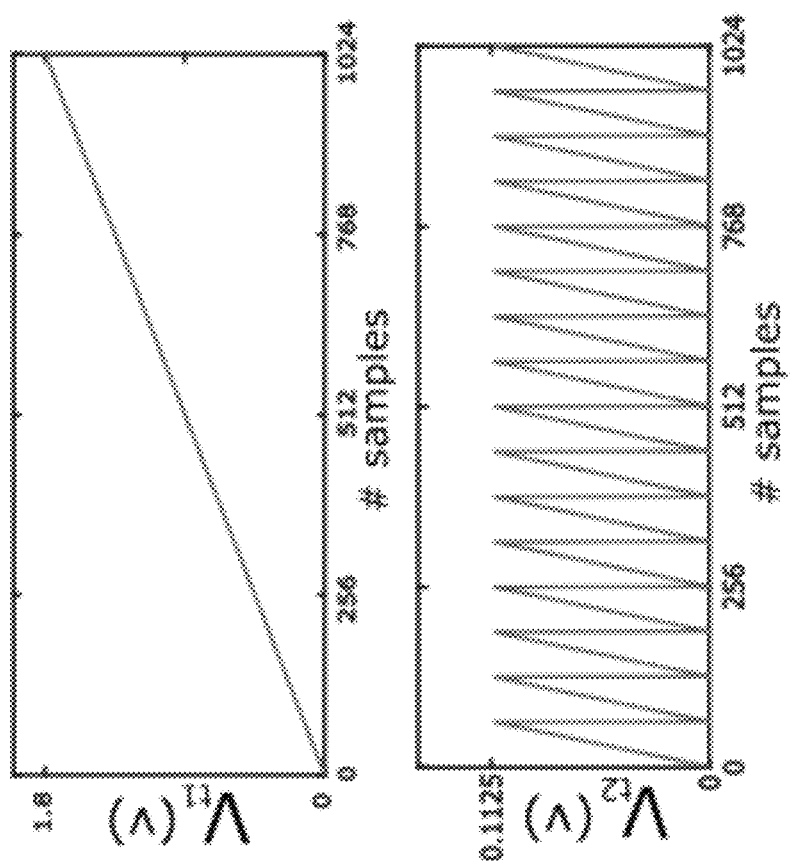
FIG. 2B shows training inputs for a two-stage pipelined ADC, according to an embodiment of the present invention.

Interestingly, Eqs. (9) and (10) can be implemented using different teaching inputs, as shown in FIG. 2B. Furthermore, the two stages can be trained independently and in parallel as their teaching datasets are supplied separately.

For the training dataset, an analog ramp signal is sampled at $4 \cdot 2^8$ (=1024). Four adjacent samples are given the same digital labels, providing an eight-bit training dataset, shown as $V_{t1}$ in FIG. 2B. The more training applied to the ADCs with extra labels, the higher conversion accuracy which may be achieved. This is because of the nonlinear nature of the ADC task. The analog ramp input with the corresponding four MSBs is used to train the first stage ADC. A sawtooth version of this input ($V_{t2}$ in FIG. 2B) with the remaining LSBs is used for the training of second stage. The switch $S_2$ is turned to position 2, when the overall mean-square-error falls below $E_{threshold}$.

Evaluation

The present pipelined ADC was simulated and evaluated SPICE (Cadence Virtuoso) using a 180 nm CMOS process and memristors fitted by the VTEAM memristor model to a Pt/HfO$_x$/Hf/TiN RRAM device. The device has an HRS/LRS of 50.

First, the learning algorithm was evaluated in terms of training error and learning time. Next, the circuit was statistically and dynamically evaluated, and finally, power consumption was analyzed. The circuit parameters are listed in Table 2 above. To test the robustness of the design, device non-idealities and noise were incorporate.

Figure 3B:
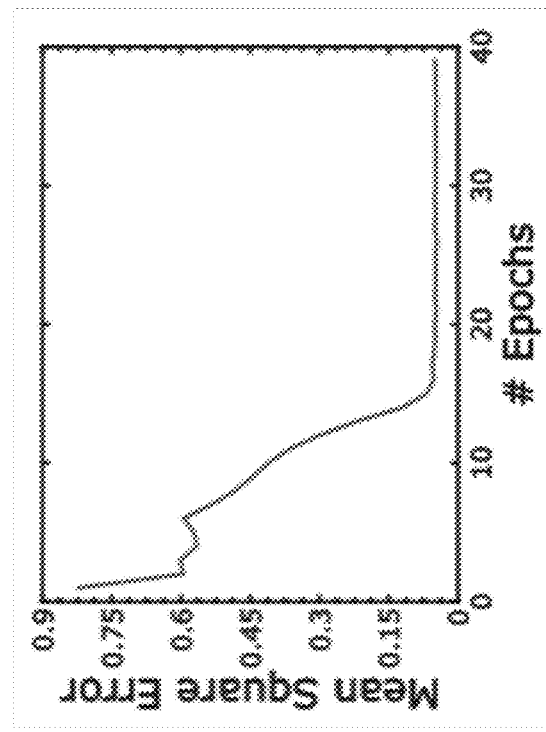
FIG. 3A-3E show evaluation results of a two-stage pipelined ADC, according to an embodiment of the present invention.
Figure 3A:
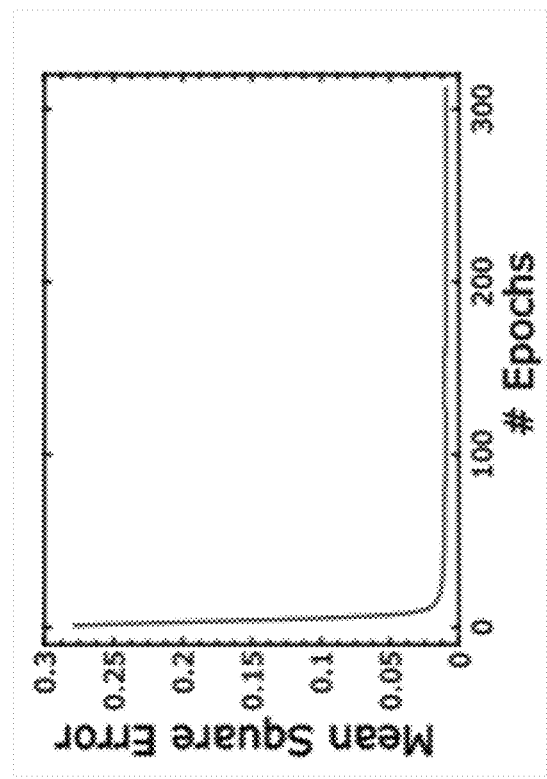

The basic deterministic functionality of the pipeline ADC was demonstrated during training by the online SGD algorithm. FIG. 3A shows the variation of the MSE of the first-stage DAC. After approximately 5,000 training samples (312 epochs), which equals 50 ms training time for a 0.1 MSPS conversion rate, the MSE error falls below $E_{threshold}$. FIG. 3B shows the total MSE of the two sub-ADCs. After approximately 40,000 training samples (39 epochs), which equals 400 ms training time, the total MSE falls below $E_{threshold}$. The analog output is converted through an ideal 8-bit DAC and probed at three different timestamps during training, as shown in FIG. 3E. The output is identical to the input staircase after the training is completed.

Linearity plots (FIG. 3C), measured for 1.8 V ramp signal sampled by 18k points at 0.1 MSPS, show that dynamic nonlinearity (DNL) is within ±0.20 LSB and integral nonlinearity (INL) is lower than ±0.18 LSB.

Figure 3D:
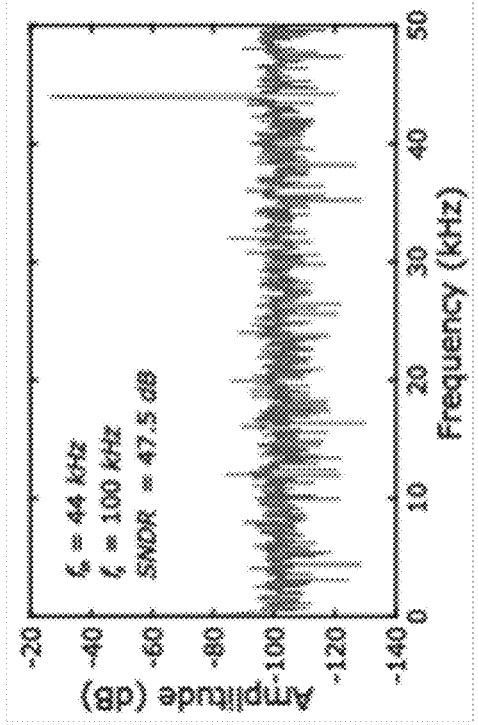
Figure 3C:
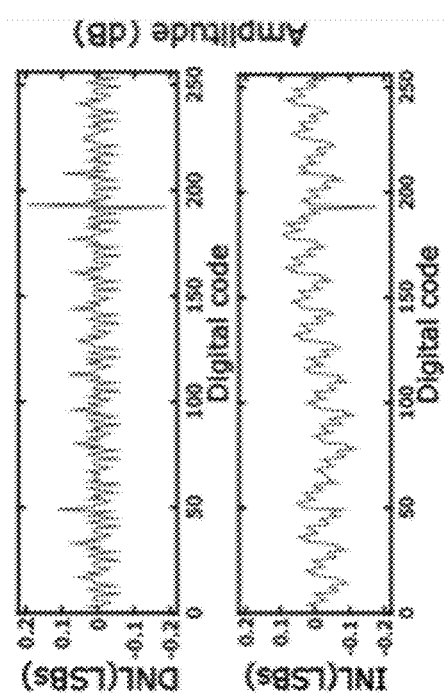
Figure 3E:
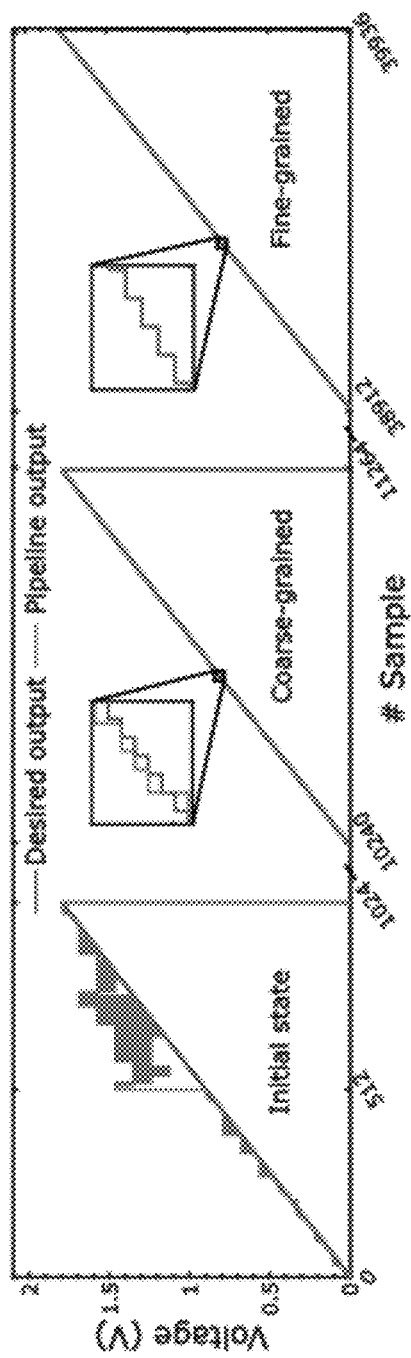

FIG. 3D shows the output spectrum at 0.1 MSPS sampling rate. The input is a 44 kHz 1.8 $V_{pp}$ sine wave. The converter achieves 47.5 dB SNDR at the end of training. Next, the power consumption of the network was analyzed by considering neural integration power, neural activation power, and synapse power. The ADC consumes 272 μW of power, averaged over a full-scale ramp with $4 \cdot 2^8$ samples. The endurance of the device is $8 \cdot 10^7$ cycles, which implies that the pipelined ADC could be reconfigured for ~55 times per day for ten years. The maximum conversion rate, $f_{max}$=1.66 GHz, is determined by the memristor cutoff frequency, the transit frequency of a 180 nm CMOS transistor, and the OpAmp slew rate.

The proposed 8-bit pipelined architecture is compared to the scaled version of neural network ADC in Danial (2018). As shown in Table 3 below, the pipelined ADC consumes less power, achieves high conversion rate, and better FOM with lesser HRS/LRS device ratio and number of resistive levels.

TABLE 3

Performance Comparison

| Parameter | NN ADC In Danial (2018) | Present ADC |
|---|---|---|
| # Bits | 8 | 8 |
| # Synapse | 36 | 24 |
| Memristor HRS/LRS | $2^8$ | $2^4$ |
| Max conversion rate (GSPS) | 0.74 | 1.66 |
| Power (μW) | 650 | 272 |
| FOM (fJ/conv) | 7.5 | 0.97[b] |
| Training time (ms) | 1060 | 400 |

To test the scalability of the present architecture, the present inventors performed behavioral simulations in MATLAB. The results for 12-bit design with ideal device parameters are summarized in Table 4 below.

TABLE 4

Scalability Evaluation

| # Bits | 12 |
|---|---|
| # Synapses | 38 |
| # Samples per epoch | $1 \cdot 2^{12}$ |
| Max |DNL| | 0.61 LSB |
| Max |INL| | 0.60 LSB |
| Training time (ms) | 2000 |

Furthermore, when the full-scale voltage is reduced to 0.9V and the sampling frequency is increased to 10 MSPS, the network converges to a new steady state to operate correctly under different specifications.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. The present specification is to be read is if all such single embodiments and separate embodiments and sub-combinations are explicitly set forth herein. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

Additional Materials

The VTEAM Memristor Model

In some embodiments, the present disclosure uses the Voltage Threshold Adaptive Memristor (VTEAM) model to accurately model the memristor's behavior in design and simulations. The model is given by the following equations $$\frac{dw(t)}{dt} = \begin{cases} k_{off} \cdot \left(\frac{v(t)}{v_{off}} - 1\right)^{\alpha_{off}} \cdot f_{off}(w), & 0 < v_{off} < v, \\ 0, & v_{on} < v < v_{off}, \\ k_{on} \cdot \left(\frac{v(t)}{v_{on}} - 1\right)^{\alpha_{on}} \cdot f_{on}(w), & 0 < v_{on} < v, \end{cases}$$

$$i(t) = G(w, v) \cdot v(t)$$

where w is an internal state variable, v(t) is the voltage across the memristive device, i(t) is the current passing through the memristive device, G(w,v) is the device conductance, $k_{off}$, $k_{on}$, $\alpha_{off}$, $\alpha_{on}$, are constants, $v_{on}$, and $v_{off}$ are threshold voltages.

HfO$_x$ Based Memristor

In some embodiments, the present disclosure uses the multi-level linearized Pt/HfO$_x$/Hf/TiN RRAM device. For this device, post fitting to the VTEAM model, the I-V relationship is given by, $$i(t) = \left[R_{on} + \frac{R_{off} - R_{on}}{W_{off} - W_{on}} \cdot (w - w_{on})\right]^{-1} \cdot v(i).$$

Artificial Synapse

Synapses are the building blocks of a neural network as they connect one neuron to the other. The strength of this connection is determined by the synaptic weight. A higher synaptic weight means strong dependency on the output of a neuron on its preceding neuron. When neuromorphic architecture is implemented on the conventional computing architecture, the synaptic weights are fetched from the memory unit to the processor unit where they are read and updated. The updated weights are stored back to the memory unit and the Von Neumann bottleneck remains a challenge.

Figure 4:
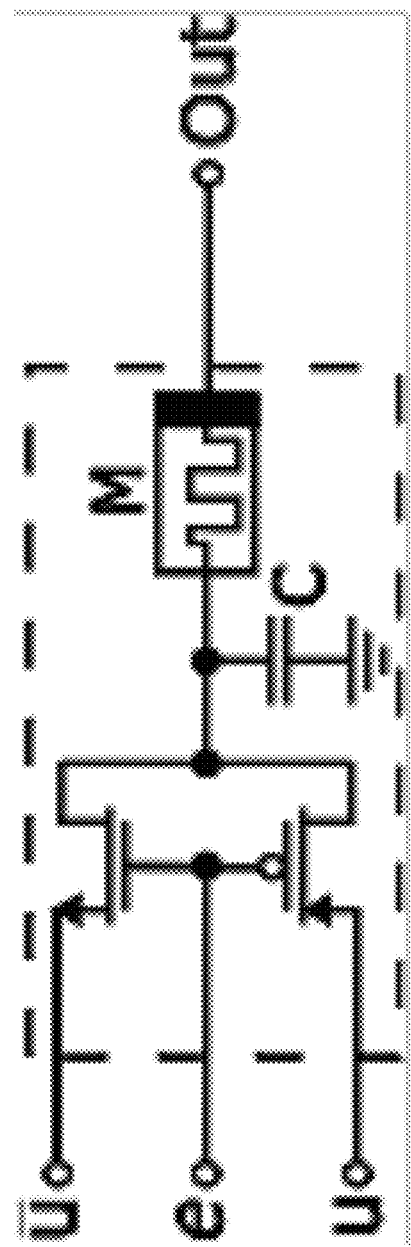
FIG. 4 shows a voltage-controlled memristor connected to the shared terminal of PMOS and NMOS, according to an embodiment of the present invention.

Accordingly, in some embodiments, the present disclosure implements artificial synapses using hybrid CMOS-memristor design. The resistance of memristors can be changed based on the history of applied electrical stimuli. This closely resembles to the biological synapses where the strength of connection increases or decreased based on the applied action potential. The memristive synapse can not only store the weight but also naturally transmit information into post-neurons, overcoming the Von Neumann bottleneck. The design consists of a voltage-controlled memristor connected to the shared terminal of PMOS and NMOS, as shown in FIG. 4. The functionality of this design is described in the context of neuromorphic ADC and DAC in the following sections.

Neuromorphic ADC

The deterministic four-bit neural network ADC converts an analog input voltage ($V_{in}$) to a digital output code ($D_3D_2D_1D_0$) according to the following iterative expressions, $$\begin{cases} D_3 = u(V_{in} - 8V_{ref}), \\ D_2 = u(V_{in} - 4V_{ref} - 8D_3), \\ D_1 = u(V_{in} - 2V_{ref} - 4D_2 - 8D_3), \\ D_0 = u(V_{in} - V_{ref} - 2D_1 - 4D_2 - 8D_3), \end{cases}$$

where $V_{ref}$ is the reference voltage equals to one full-scale voltage quantum (LSB), and u(·) is the signum neural activation function (neuron) having either zero or full-scale voltage output. The neural network shown in FIG. 1A implements this in hardware using reconfigurable synaptic weights ($W_{i,j}$—conductance between a pre-synaptic neuron with index j and a post-synaptic neuron with index i) to address their non-deterministic distribution in real-time operation and post-silicon fabrication. As shown in FIG. 1A, the synapses are realized using one NMOS, one PMOS and one memristor, with gates of the transistors connected to a common enable input e]. When e=$V_{DD}$ (−$V_{DD}$), the NMOS (PMOS) switches on and u (−ū) is passed to the output. When e=0, both transistors are off and the output is zero. As shown in FIG. 1B, the neurons comprise of an inverting op-amp for integration and a latched comparator for decision making.

Synaptic weights are tuned to minimize the mean square error (MSE) by using the stochastic gradient descent (SGD) learning rule, $$\Delta W_{ij(j>i)}^{(k)} = -\eta (T_i^{(k)} - D_i^{(k)}) T_j^{(k)},$$

where η is the learning rate (a small positive constant), and in each iteration k, the output of the network $D_i^{(k)}$ is compared to the desired teaching label $T_i^{(k)}$ that corresponds to the input $V_{in}^{(k)}$. The training continues until the training error falls to $E_{threshold}$, a predefined constant that defines the learning accuracy.

Neuromorphic DAC

A previously proposed neural network DAC converts the four-bit digital input code ($V_3V_2V_1V_0$) to an analog output (A) as, $$A = \frac{1}{2^4} \sum_{i=0}^{3} 2^i V_i,$$

where binary weights ($2^i$) are implemented with reconfigurable synaptic weights $W_i$ and having similar realization as in FIG. 1A.

Figure 5A:
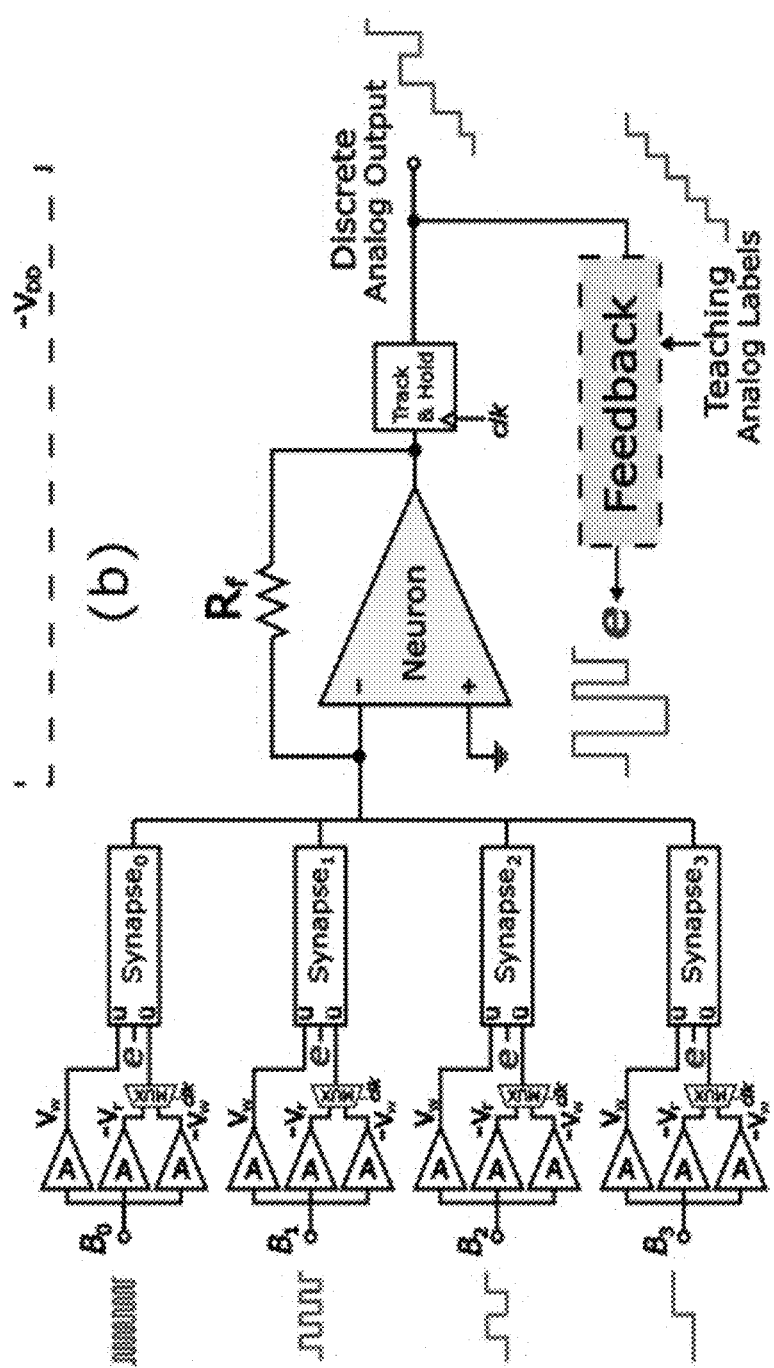
FIG. 5A shows the four synapses collectively integrate the input through the neuron (op-amp) to produce the output, according to an embodiment of the present invention.

As shown in FIG. 5A, the four synapses collectively integrate the input through the neuron (op-amp) to produce the output. This output is compared to the analog teaching labels in the pulse width modulation (PWM)-based feedback circuit, which regulates the value of the weights in real-time according to the time-varying gradient descent learning rule, $$\Delta W_i^{(k)} = -\eta(t)(V_{out}^{(k)} - t^{(k)})D_i^{(k)},$$

where $\eta(t)$ is the time-varying learning rate, and $t^{(k)}$ is the analog teaching label. The feedback is disconnected after the training is complete ($E < E_{threshold}$).

ADC Performance Metrics

The ADC is evaluated statistically for differential non-linearity (DNL) and integral non-linearity (INL). These are defined as, $$DNL(j) = \frac{V_{j+1} - V_j}{LSB_{ideal}}$$

$$INL(j) = \sum_{i=1}^{j} DNL(i)$$

where $V_j$ and $V_{j+1}$ are adjacent code transition voltages, and $j \in \{x | 1 \leq x \leq 2^{N-2}\}$.

The Signal to Noise and Distortion Ratio (SNDR) is calculated from the FFT plot of ADC's output as, $$SNDR = P_{signal} - P_{noise}$$
$$P_{signal} = P_{peak} + CPG + Scalloping_{Loss}$$
$$P_{noise} = P_{noise-floor} + P_G + CPG - ENBW$$
$$P_G = 10 \cdot \log_{10} \frac{N}{2}$$

where $P_{peak}$ is the peak signal power from the FFT plot, $P_{noise-floor}$ is the average noise power, N is the total number of bits, and CPG, Scalloping_Loss, ENBW are window-dependent parameters.

The Effective Number of Bits (ENOB) is calculated from the SNDR as, $$ENOB = \frac{SNDR(dB) - 1.76}{6.02}$$

The figure-of-merit (FOM) relates the ADC's sampling frequency, $f_s$, power consumption during conversion, P, and effective number of bits, ENOB. A lower value of FOM signifies better overall performance. FOM is defined as, $$FOM = \frac{P}{2^{ENOB} \cdot f_s} [J/conv]$$

Scaling Challenges

Increasing the scale of the neural network ADC described above, above four bits, is challenging. Table 1 above highlights the effect of scaling on design and performance parameters of the ADC. The number of synapses in the network increases quadratically. Consequently, the area and power consumption rise significantly. Moreover, there is an exponential rise in the aspect ratio of synaptic weights, which is practically limited by the high-to-low resistive states ratio (HRS/LRS), number of resistive levels, endurance of the memristor, and time and power consumption of the training phase—ultimately limiting the practical achievable resolution to four-bits. Additionally, higher number of neurons require longer conversion-time which limits the maximal Nyquist sampling frequency.

Memristive Pipelined Neuromorphic Analog-to-Digital Converter

Introduction to Pipelined ADCs

Figure 5B:
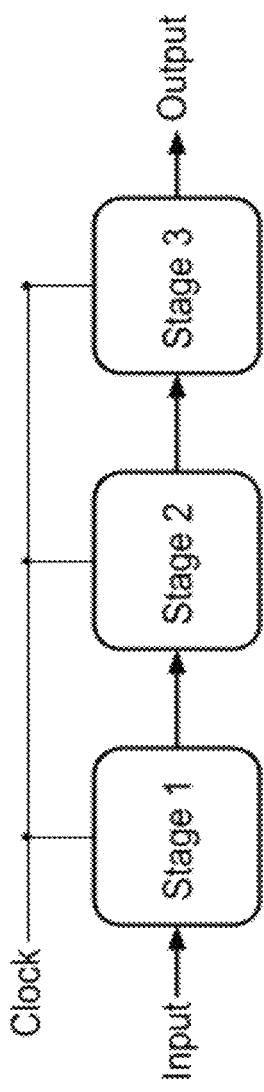
FIG. 5B shows a general concept of pipelining, according to an embodiment of the present invention.

Pipeline is a technique where multiple instructions are overlapped during execution. It is divided into stages which are connected with one another to form a pipe like structure, as shown in FIG. 5B, which shows a general concept of pipelining. When one stage finishes execution, its output is sent to the following stage, allowing it to execute the next instruction. Thus, multiple instructions may be executed simultaneously. Pipeline increases the overall throughput on the expense of latency. With increase in number of stages, latency increases. Throughput is limited by the execution speed of the slowest stage. Analog-to-digital conversion can be performed in a pipelined fashion.

Figure 5C:
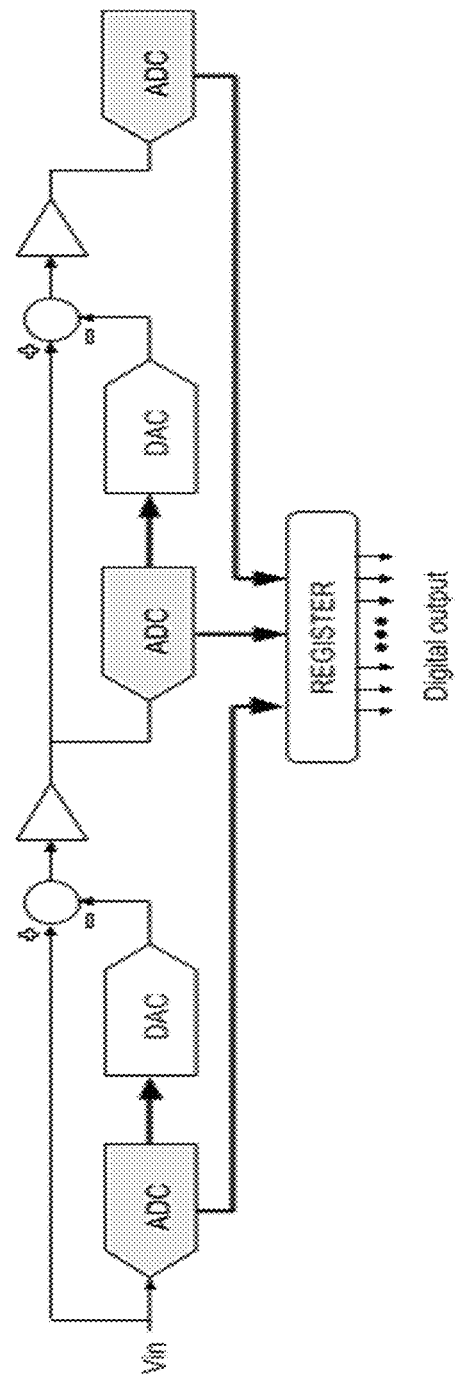
FIG. 5C shows the schematic of a conventional pipelined ADC, according to an embodiment of the present invention.

FIG. 5C shows the schematic of a conventional pipelined ADC. Quantization of the input analog signal is divided into stages, where each stage resolves a specific number of bits. After one stage performs conversion, the remaining information is present in the quantization error (analog input minus digital output converted back to analog) which is amplified, tracked and held for the next stage. The digital output of each stage is time-aligned using digital logic.

Neural Network Architecture

In some embodiments, the present disclosure uses light-weight coarse-resolution neural network ADCs and DACs to build a fine-resolution pipelined network. An eight-bit two-stage pipelined ADC is shown in FIG. 2A In the first-stage sub-ADC, a synapse $W_{ij}$ is present between a pre-synaptic neuron with index j and digital output $D_j$, and a post-synaptic neuron with index i, and digital output $D_i$. A neuron for each bit collectively integrates inputs from all synapses and produces an output by the signum neural activation function $u(\cdot)$. The sub-ADC coarsely quantizes (MSBs) the sampled input $V_{in}$ to the digital code $D_7D_6D_5D_4$(MSB to LSB) as, $$\begin{cases} D_7 = u(V_{in} - 8V_{ref}), \\ D_6 = u(V_{in} - 4V_{ref} - W_{6,7}D_7), \\ D_5 = u(V_{in} - 2V_{ref} - W_{5,6}D_6 - W_{5,7}D_7), \\ D_4 = u(V_{in} - V_{ref} - W_{4,5}D_5 - W_{4,6}D_6 - W_{4,7}D_7). \end{cases}$$

The output of the sub-ADC is converted back to an analog signal A by the DAC as, $$A = \frac{1}{2^4} \sum_{i=4}^{7} W_i D_i,$$

where $W_i$ are the synaptic weights. Next, this output is subtracted from the held input to produce a residue Q as, $$Q = V_{in} - A.$$

This residue is sent to the next stage of the pipeline, where it is first sampled and held. The second stage sub-ADC is designed similar to that of the first stage, except that the resistive weights of the input are modified from $R_{in} = R_f$ (feedback resistance of neuron) to $R_f/16$. This is made in order to scale the input from $V_{FS}/16$ to the full-scale voltage $V_{FS}$. The LSBs of the digital output are obtained from this stage as $$\begin{cases} D_3 = u(16Q - 8V_{ref}), \\ D_2 = u(16Q - 4V_{ref} - W_{2,3}D_3), \\ D_1 = u(16Q - 2V_{ref} - W_{1,2}D_2 - W_{1,3}D_3), \\ D_0 = u(16Q - V_{ref} - W_{0,1}D_1 - W_{0,2}D_2 - W_{0,3}D_3). \end{cases}$$

The sample-and-hold circuit enables concurrent operation of the two stages, achieving a high throughput rate, but introduces latency of two clock cycles. Thus D-flipflop registers are used to time-align the MSBs and the LSBs.

Trainable neural network ADC/DAC cores in this design have minimalistic design with mismatch self-calibration, noise tolerance, and power consumption optimization. This eliminates the need for an exclusive inter-stage gain unit and calibration mechanism, because the residue is amplified by the input resistive weight of the second sub-ADC. Although resistors are highly prone to manufacturing variations, they can be effectively used as the input weights because their mismatches will be calibrated for by other memristive weights in the second stage. Furthermore, the training algorithm ensures that the quantization error remains within tolerable limits without using digital calibration techniques.

Training Framework

The aim of the training is to configure the network from a random initial state (random synaptic weights) to an accurate eight-bit ADC. It is achieved by minimizing the mean-square-error (MSE) of each sub-ADC and the DAC by using specific teaching labels for desired quantization. During the training phase, switches $S_1$ and $S_2$ are in position 1.

The DAC is supplied with four-bit digital teaching labels corresponding to an analog ramp input, as shown in FIG. 2A. The binary-weighted time-varying gradient descent rule may be used to minimize the MSE between the estimated and desired label. Learning parameters are listed in Table 2 above. The DAC is connected to the sub-ADC by switch $S_1$ when the error falls below $E_{threshold}$.

The accuracy requirements of each stage decrease through the pipeline and the first stage should be accurate to the overall resolution. Moreover, the two-stages operate on different inputs for different quantization. Thus, their teaching dataset must be different to execute the online SGD algorithm as, $$\Delta W_{ij(j>i)}^{(k)} = -\eta_{ADC}(T_i^{(k)} - D_i^{(k)})T_j^{(k)}, 0 \leq i,j \leq 3,$$

$$\Delta W_{ij(j>i)}^{(k)} = -\eta_{ADC}(T_i^{(k)} - D_i^{(k)})T_j^{(k)}, 4 \leq i,j \leq 7,$$

Interestingly, the above equations can be implemented using different teaching inputs, as shown in FIG. 2B. Furthermore, the two stages can be trained independently and in parallel as their teaching datasets are supplied separately.

For the training dataset, an analog ramp signal is sampled at $4 \cdot 2^8$ (=1024). Four adjacent samples are given the same digital labels, providing an eight-bit training dataset, shown as $V_{t1}$ in FIG. 2B. The more the ADCs are trained with extra labels, the higher conversion accuracy is achieved. This is because of the nonlinear nature of the ADC task. The analog ramp input with the corresponding four MSBs is used to train the first stage ADC. A sawtooth version of this input ($V_{t2}$ in FIG. 2B) with the remaining LSBs is used for the training of second stage. The switch $S_2$ is turned to position 2, when the overall mean-square-error falls below $E_{threshold}$.

4.2.3 Performance Evaluation

The present proposed pipelined ADC is simulated and comprehensively evaluated in SPICE (Cadence Virtuoso) using a 180 nm CMOS process and memristors fitted by the VTEAM memristor model to a Pt/HfO$_x$/Hf/TiN RRAM device. The device has an HRS/LRS of 50. First, the learning algorithm was evaluated in terms of training error and learning time. Next, the circuit is statistically and dynamically evaluated, and finally, power consumption is analyzed. The circuit parameters are listed in Table 2 above. To test the robustness of the design, device non-idealities and noise were incorporated.

The basic deterministic functionality of the pipeline ADC is demonstrated during training by the online SGD algorithm. FIG. 3A shows the variation of the MSE of the first-stage DAC. After approximately 5,000 training samples (312 epochs), which equals 50 ms training time for a 0.1 MSPS conversion rate, the MSE error falls below $E_{threshold}$. FIG. 3B shows the total MSE of the two sub-ADCs. After approximately 40,000 training samples (39 epochs), which equals 400 ms training time, the total MSE falls below $E_{threshold}$. The analog output is converted through an ideal 8-bit DAC and probed at three different timestamps during training, as shown in FIG. 3E. The output is identical to the input staircase after the training is completed.

Linearity plots (FIG. 3C), measured for 1.8 V ramp signal sampled by 18k points at 0.1 MSPS, show that dynamic nonlinearity (DNL) is within ±0.20 LSB and integral nonlinearity (INL) is lower than ±0.18 LSB. FIG. 3D shows the output spectrum at 0.1 MSPS sampling rate. The input is a 44 kHz 1.8 $V_{pp}$ sine wave. The converter achieves 47.5 dB SNDR at the end of training. Next, the power consumption of the network was analyzed by considering neural integration power, neural activation power, and synapse power. Remarkably, the total power consumption is optimized during training. The ADC consumes 272 µW of power, averaged over a full-scale ramp with $4 \cdot 2^8$ samples.

Figure 6A:
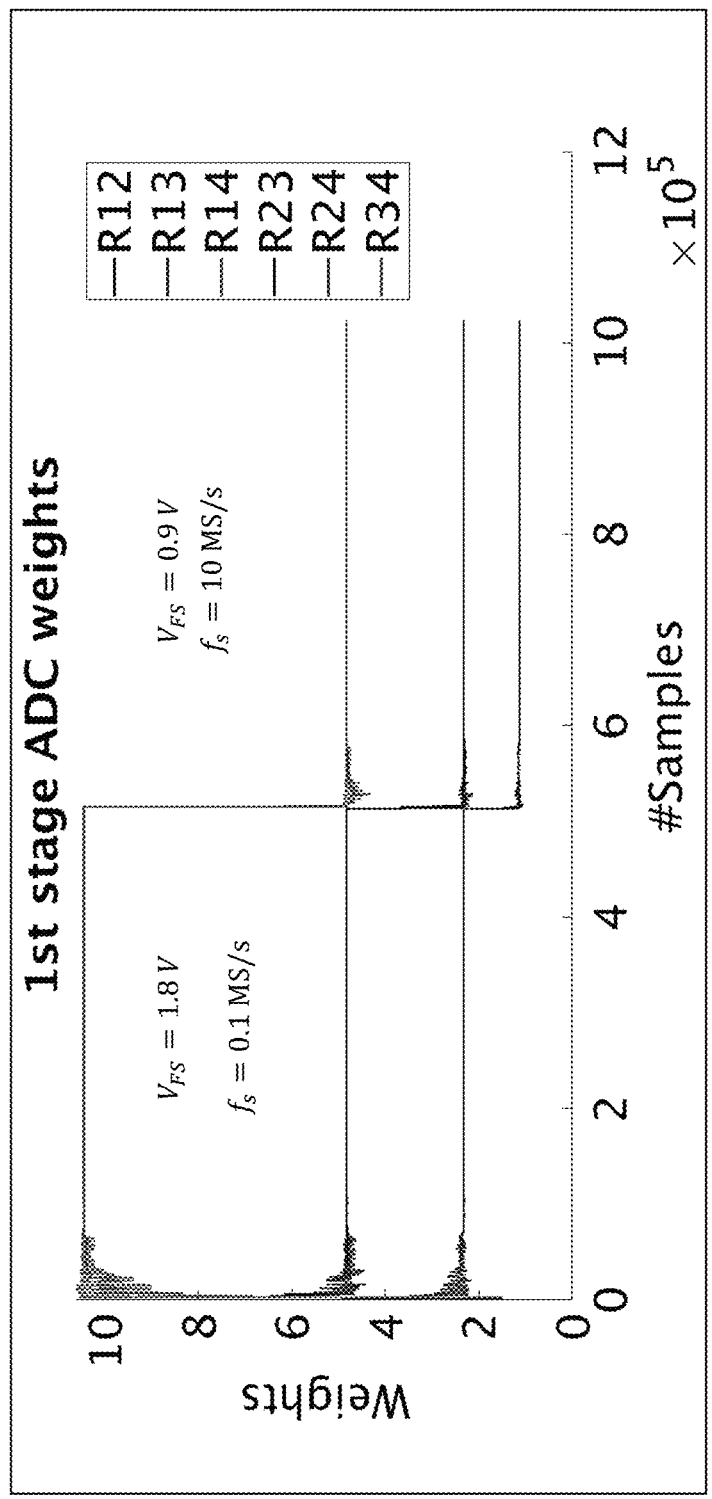
FIGS. 6A-6C show variation of synaptic weights of the sub-ADC and the DAC during training showing self-reconfiguration when the full-scale voltage and sampling frequency are changed, according to an embodiment of the present invention.
Figure 6B:
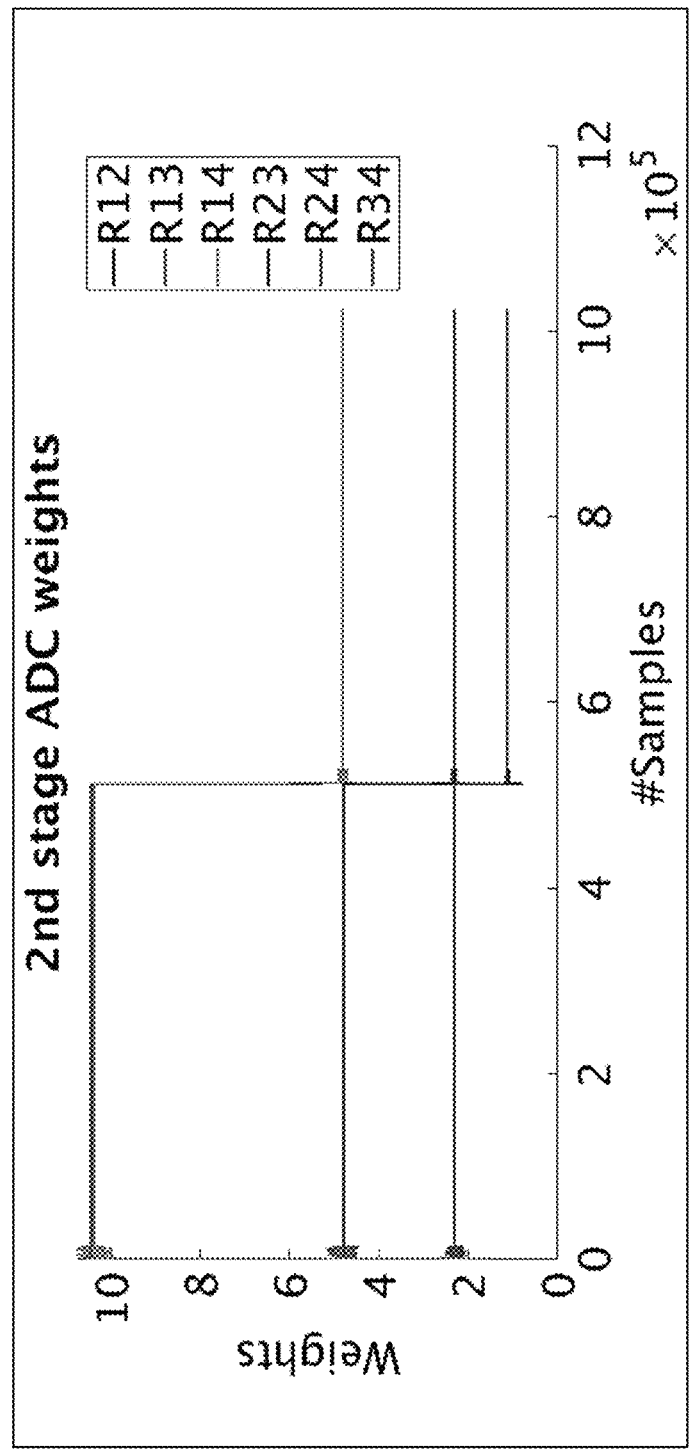
Figure 6C:
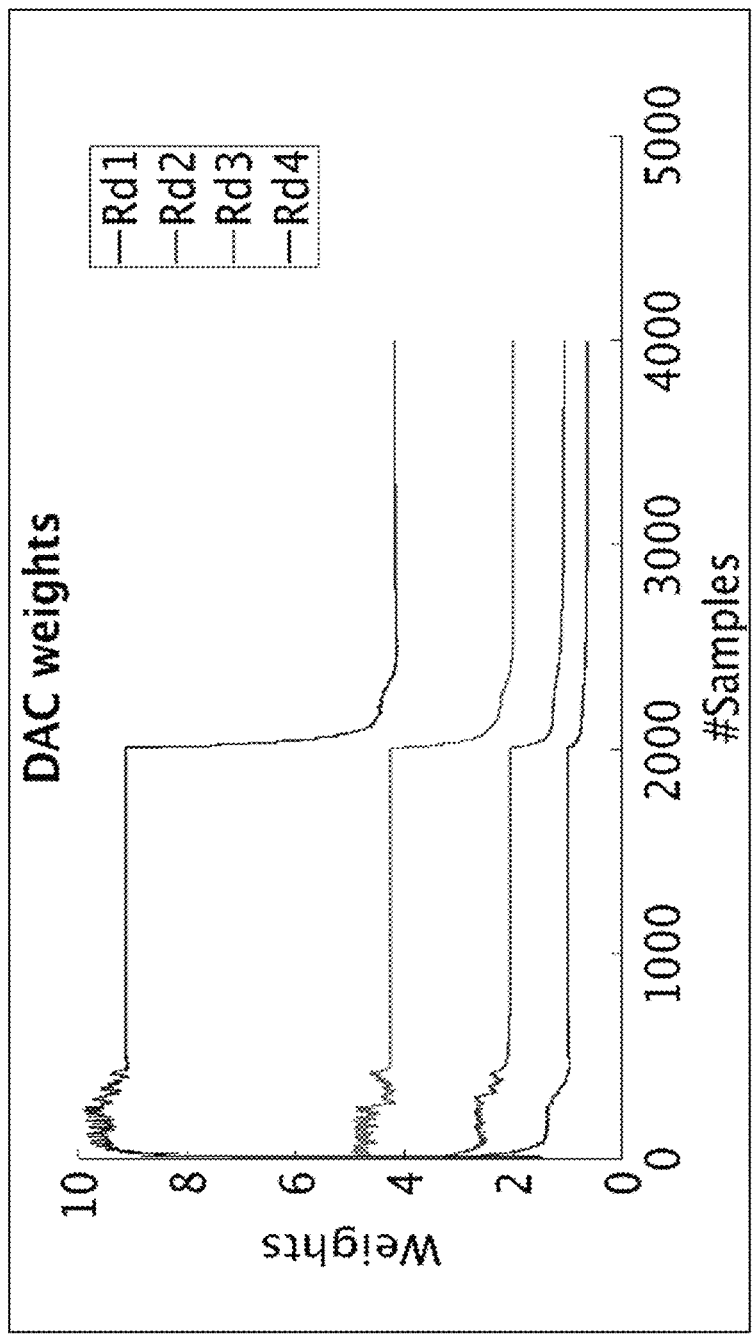

The pipelined ADC is tested for reconfigurability by changing the full-scale voltage from 1.8 V to 0.9 V and sampling frequency from 0.1 MS/s to 10 MS/s. The synaptic weights of the sub-ADCs and the DAC converges to new steady state to operate correctly under different specifications, as shown in FIG. 6A-6C. From the values of power consumption, maximum conversion speed and ENOB, the pipelined ADC achieves a FOM of 0.97 fJ/conv at the full-scale voltage. FIGS. 6A-6C show variation of synaptic weights of the sub-ADC and the DAC during training showing self-reconfiguration when the full-scale voltage and sampling frequency are changed.

Performance Comparison

This 8-bit pipelined architecture is compared to the scaled version of neural network ADC. As shown in Table 3 above, the pipelined ADC consumes less power, achieves high conversion rate, and better FOM with lesser HRS/LRS device ratio.

Scalability Evaluation

To test the scalability of the present architecture, behavioral simulations were performed in MATLAB. Results for 12-bit design with ideal device parameters are summarized in Table 4 above.

Logarithmic Neuromorphic Data Converters

Figure 7:
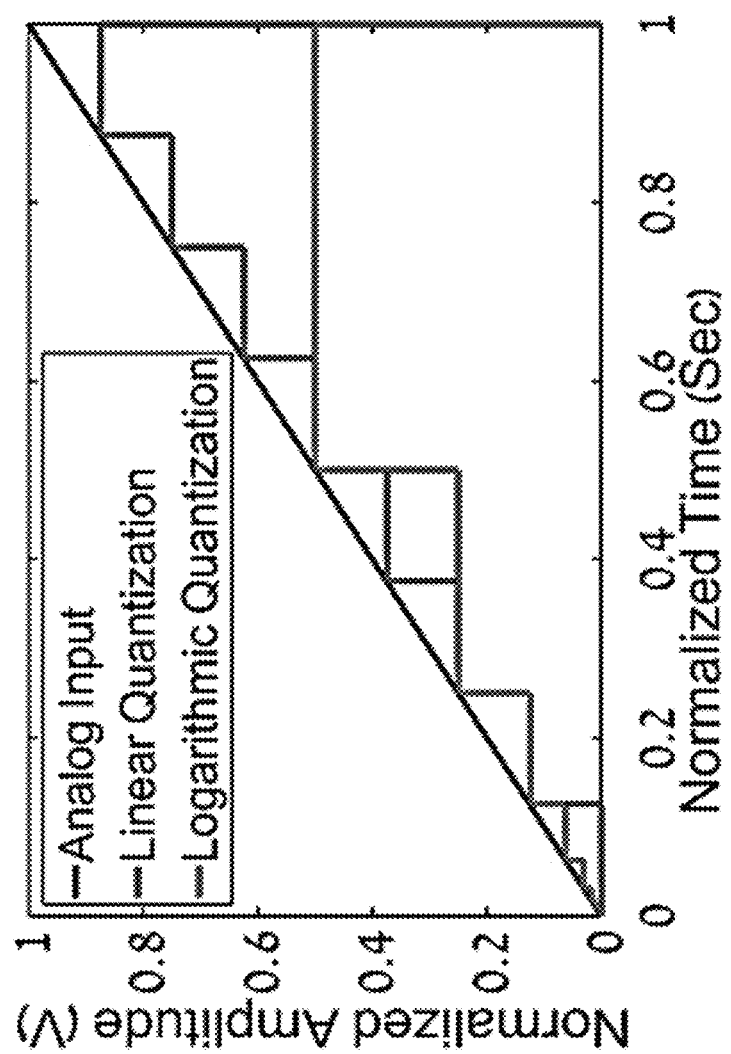
FIG. 7 shows the characteristics of linear and logarithmic quantization.

A logarithmic ADC performs conversions with non-uniform quantization, where small analog amplitudes are quantized with fine resolution, while large amplitudes are quantized with coarse resolution. FIG. 7 shows the characteristics of linear and logarithmic quantization.

Applications of Logarithmic Data Converters

For several biomedical applications, such as cochlear implants, hearing aids, neural recording and stimulation, a nonlinear analog-to-digital converter (ADC) seems a more appealing choice for a signal processing system than a linear ADC. Audio signals, for example, are well-suited to log encoding because the human ear is less able to distinguish sound levels when the dynamic range of the signals is larger. The benefits of a nonlinear ADC include the ability to handle input signals with a large dynamic range, reduction of noise and data bit-rate, and compensation for nonlinear sensor characteristics.

Logarithmic ADC

An N-bit logarithmic ADC converts an analog input voltage ($V_{in}$) to an N-bit digital output code ($D_{out} = D_{N-1}, \ldots, D_0$) according to a logarithmic mapping described by, $$\sum_{i=0}^{N-1} D_i 2^i = \frac{2^N}{c} \log_B\left(\frac{V_{in}}{V_{FS}} B^c\right),$$

where N is the number of bits, B is the base of the logarithmic function (e.g., 10), C is defined as the code efficiency factor, and $V_{FS}$ is the full-scale analog input voltage range. Larger values of C result in more logarithmic conversion, capturing smaller signals and a higher dynamic range. The equation above implies that the logarithmic ADC achieves good resolution for small input signals, but still allows coarsely quantized large input signals. Quantization noise is thus lower when the signal amplitude is small, and it grows with the signal amplitude.

For small input amplitudes, the LSB size is small and has a minimum value of, $$LSB_{min} = V_{FS} B^{-C}\left(B^{\frac{C}{2^N}} - 1\right),$$

when $D_{out}$ changes from 0 to 1. For large input amplitudes, the LSB size is larger and has a maximum value of, $$LSB_{max} = V_{FS}\left(1 - B^{-\frac{C}{2^N}}\right),$$

when $D_{out}$ changes from $2^N-2$ to $2^N-1$. The dynamic range (DR) of an ADC is defined by the ratio of the maximum input amplitude to the minimum resolvable input amplitude, $$DR(dB) = 20\log_{10}\left(\frac{V_{FS}}{LSB_{min}}\right) = 20\log_{10}\left(\frac{B^C}{B^{\frac{C}{2^N}} - 1}\right).$$

The DNL and INL for logarithmic ADC are defined similarly to the linear ADC except that in a logarithmic ADC the ideal step size varies with each step, $$DNL(j) = \frac{V_{j+1} - V_j}{LSB_{ideal}},$$

$$INL(j) = \sum_{i=1}^{j} DNL(i),$$

where $V_j$ and $V_{j+1}$ are adjacent code transition voltages, and $j \in \{x | 1 <= x <= 2^N - 2\}$.

Logarithmic DAC

An N-bit logarithmic DAC converts an N-bit digital input code ($D_{in}$) to an analog output voltage ($V_{out}$) according to a logarithmic (exponential) mapping described by $$V_{out} = \frac{V_{FS}}{2^{N-1}} B^{\sum_{i=0}^{N-1} D_i 2^i}.$$

Exponential DAC, cascaded to a logarithmic ADC, is required to reproduce the linear analog input of the ADC. The INL, DNL, and ENOB for logarithmic DAC are defined as for the linear DAC, after activating a logarithmic transformation on Vout.

Trainable Neural Network Logarithmic ADC

In some embodiments, the present disclosure utilizes the learning capabilities of ANNs, applying linear vector-matrix-multiplication and non-linear decision-making operations to train them to perform logarithmic quantization. Therefore, the logarithmic ADC equations are formulated in an ANN-like manner as follows, using three bits as an example, $$\begin{cases} D_2 = u(V_{in} - 2^4 V_{ref}) \\ D_0 = u(V_{in} - 2^2 V_{ref} - \overline{D_2} - 2^6 D_2) \\ D_1 = u(V_{in} - 2 V_{ref} \overline{D_1 D_2} - 2^3 D_1 \overline{D_2} - 2^5 \overline{D_1} D_2 - 2^7 D_1 D_2) \end{cases},$$

where $V_{in}$ is the analog input and $D_2 D_1 D_0$ is the corresponding digital form (i=2 is the MSB), while each $\overline{D_i}$ is the complement of each digital bit, and each bit (neuron product) has either zero or full-scale voltage. $u(\cdot)$ is denoted as the signum neural activation function, and $V_{ref}$ is a reference voltage equal to $LSB_{min}$. Each neuron is a collective integrator of its inputs. The analog input is sampled and successively (by a pipeline) approximated by a combination of binary-weighted inhibitory synaptic connections between different neurons and their complement.

In a real-time operation, where non-ideal, stochastic, and varying conditions affect the conversion accuracy, the correct weights are not distributed deterministically in binary-weighted style. Rather, the weights should be updated in real-time in situ by a training mechanism. Four interconnected weights are needed to implement a three-bit logarithmic ADC. The interconnected synaptic weights of the network are described by an asymmetric matrix W, and each element $W_{ij}$ represents the synaptic weight of the connection from pre-synaptic neuron j to post-synaptic neuron i. In the linear ADC case, i and j were bounded by the network dimensions, which are equal to N. However, in this case, where have additional synaptic connections are present due to the AND product between neurons and their complements, the matrix dimensions approach $(2^{N-1}+2)$.

To train this network, W is tuned to minimize some measure of error (e.g., MSE) between the estimated and desired labels, over a training set. The online stochastic gradient descent (SGD) algorithm is used to minimize the error, $$\Delta W_{ij(j>i)}^{(k)} = -\eta(T_i^{(k)} - D_i^{(k)}) T_j^{(k)},$$

where $\eta$ is the learning rate, a small positive constant, and in each iteration k, a single empirical sample $V_{in}^{(k)}$ is chosen randomly and compared to a desired teaching label $T^{(k)}$. The training phase continues until the error is below $E_{threshold}$.

Trainable Neural Network Logarithmic DAC

The logarithmic DAC equations are formulated in an ANN-like manner as follows, using three bits as an example, $$V_{out}=2^0\overline{D_0D_1D_2}+2^1D_0\overline{D_1D_2}+2^2\overline{D_0}D_1\overline{D_2}+2^3D_0D_1\overline{D_2}+2^4\overline{D_0D_1}D_2+2^5D_0\overline{D_1}D_2+2^6\overline{D_0}D_1D_2+2^7D_0D_1D_2. \quad (30)$$

Thus, the logarithmic DAC is realized by a single-layer ANN with a linear neural activation output function and 2N synapses. The DAC is trained using online SGD, with a time-varying learning rate and a teaching analog signal $t^{(k)}$, $$\Delta W_i^{(k)}=-\eta(t)(V_{out}^{(k)}-t^{(k)})D_i^{(k)}.$$

Circuit Design of Neural Network Logarithmic ADC/DAC

Figure 8:
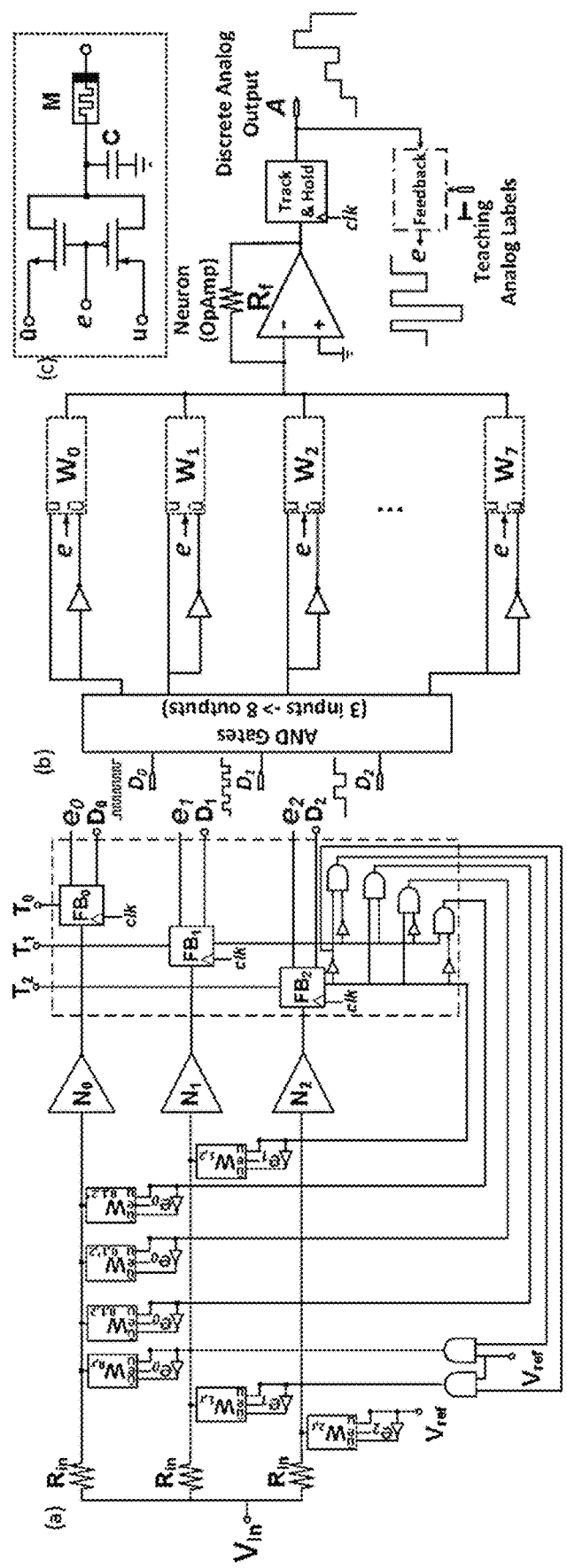
FIG. 8 shows (a) architecture of the proposed 3-bit logarithmic neural network ADC; (b) Architecture of proposed 3-bit logarithmic neural network DAC; (c) Schematic of artificial synapse, according to an embodiment of the present invention.

The neural network ADC/DAC architectures and their building blocks, including neurons, synapses, and training feedbacks, are illustrated in FIG. 8. FIG. 8 shows (a) architecture of the proposed 3-bit logarithmic neural network ADC; (b) Architecture of proposed 3-bit logarithmic neural network DAC; (c) Schematic of artificial synapse.

The synapse and Neuron circuit designs are explained above. The memristive crossbar (2T1R) inherently implements Ohm's and Kirchhoff's laws for ANN hardware realization. The present ADC/DAC was designed using a 0.18 μm CMOS process and memristors fitted by the VTEAM model to a Pt/HfO$_x$/Hf/TiN RRAM device.

This device has a high-to-low resistance state (HRS/LRS) ratio of 50 to 1000. The aspect weight ratio of the ADC/DAC is equal to $2^{2^{N-1}}$ (for $V_{FS}=V_{DD}/2$). The HRS/LRS ratio sets an upper bound on the number of conversion bits. For example, four-bit logarithmic ADC/DAC is infeasible using this device. Thus, a three-bit logarithmic ADC/DAC is demonstrated, which has better DR than a four-bit linear ADC/DAC. Table V lists the circuit parameters.

Neuron values are multiplied using AND gates, added to the DAC and ADC in the frontend and backend, respectively. The online SGD algorithm is executed by the feedback circuit, which precisely regulates the synaptic reconfiguration. The aim is to implement the equations above and execute basic subtraction and multiplication operations.

While the feedback of the ADC is simple and realized by digital circuits, the feedback of the DAC is implemented by a pulse width modulator (PWM) with time proportional to the error and $\pm V_{DD}$, 0 V pulse levels. After the training is complete (E≤E$_{threshold}$), the feedback is disconnected from the conversion path.

Performance Evaluation

The present proposed three-bit logarithmic ANN ADC/DAC design is simulated and evaluated using Cadence Virtuoso. First, the MSE and training time of the learning algorithm are evaluated. Next, the circuit is statically and dynamically evaluated, and finally power consumption is analyzed. Functionality and robustness were massively tested under extreme conditions using MATLAB. The design parameters are listed in Table 5 below. Furthermore, circuit variations and noise sources are quantified and validated.

TABLE 5

LOG ADC/DAC CIRCUIT PARAMETERS

| Parameter | Value | Parameter | Value |
|---|---|---|---|
| Power Supply | | Feedback resistor | |
| $V_{DD}$ | 1.8 V | $R_f$ | 400 kΩ |

TABLE 5-continued

LOG ADC/DAC CIRCUIT PARAMETERS

| NMOS | | PMOS | |
|---|---|---|---|
| W/L | 10 | W/L | 20 |
| $V_{TN}$ | 0.56 V | $V_{TP}$ | −0.57 V |

| Memristor | | | |
|---|---|---|---|
| $V_{on/off}$ | −0.3 V, 0.4 V | $R_{on/off}$ | 2 kΩ, 1.5 MΩ |
| $K_{on/off}$ | −4.8 mm/s, 2.8 mm/s | $\alpha_{on/off}$ | 3, 1 |

| Reading voltage & time | | Writing voltage & time | |
|---|---|---|---|
| $V_r$ | −0.1125 V | $V_W$ | ±0.5 V |
| $T_r$ | 5 μs | $T_w$ | 5 μs |

| Learning parameters | | 3-bit ADC/DAC parameters | |
|---|---|---|---|
| η | 0.01 | $f_s$ | 0.1 MSPS |
| $E_{threshold}$ | 2·10$^{-3}$ | $V_{FS}$ | $V_{DD}$ |

Figure 9:
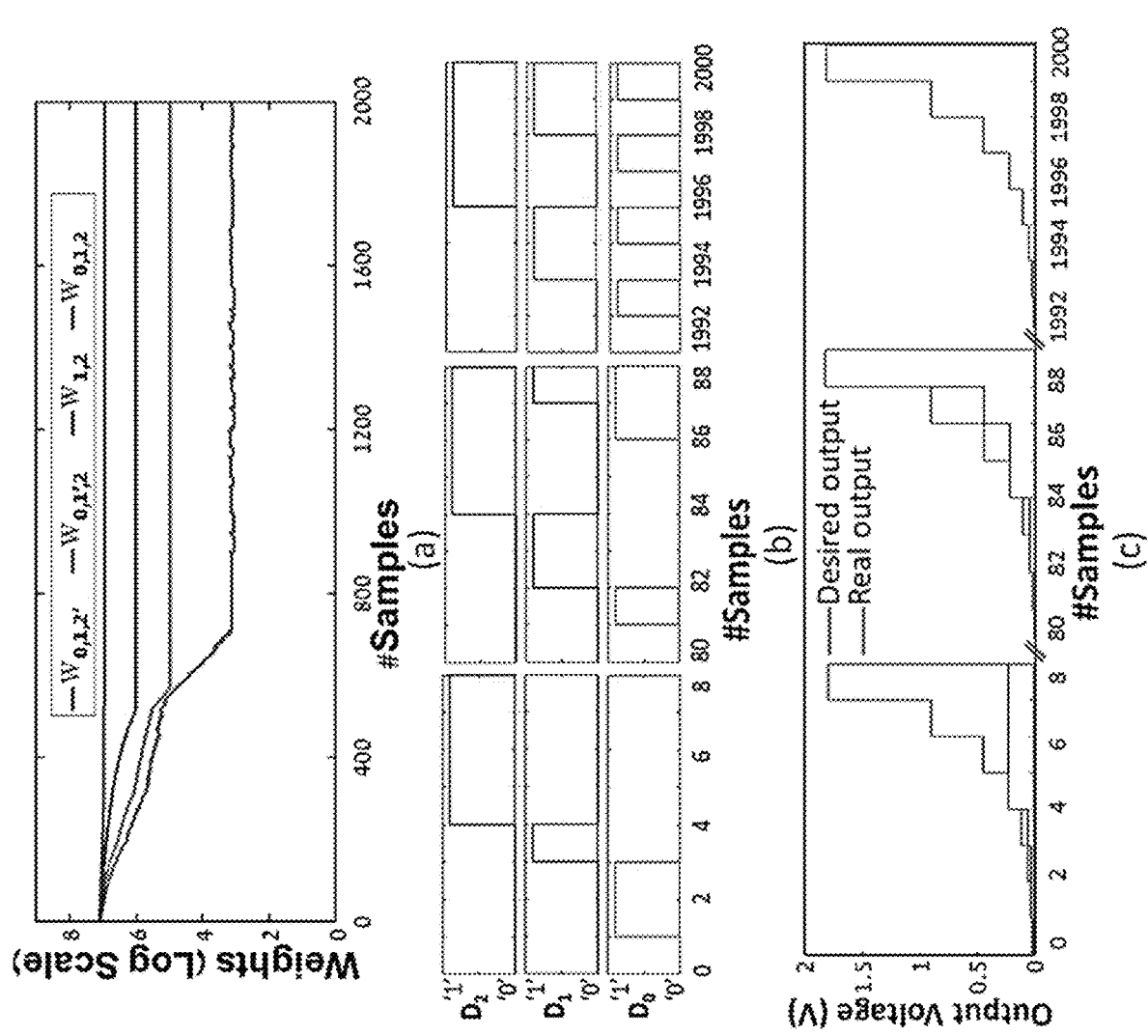
FIG. 9 shows logarithmic ADC training evaluation, according to an embodiment of the present invention.

The basic deterministic functionality of the three-bit logarithmic ADC/DAC is demonstrated during training by the online SGD algorithm. FIG. 9 shows logarithmic ADC training evaluation. 9(*a*): Synapse reconfiguration (in log scale) during training for N=3, $V_{FS}$=1.8V and $f_s$=100 KSPS. The weight is equal to the ratio between $R_f$ and the corresponding memristor; thus, it has no units. 9(*b*): The actual digital outputs $D_i$ (logical value) at three different time stamps during training; periodic outputs are obtained, corresponding to the logarithmic analog input ramp. 9(*c*): Comparison between the corresponding discrete analog values of the teaching dataset and the actual output; an identical logarithmic staircase is obtained after the training is complete.

FIG. 9(*a*) shows the resistive value of the synapses when a logarithmic ramp training dataset with full-scale voltage $V_{DD}$ and sampling frequency $f_s$ are applied in real time. After approximately 2000 training samples, which equals 20 ms training time for a 0.1 MSPS conversion rate, the MSE is below $E_{threshold}$ and the network converges from a random initial state to a steady state. In the same context, the convergence of digital output bits (neurons) converged to logarithmic codes is shown, at three time stamps, in FIG. 9(*b-c*).

It is shown that the proposed training algorithm compensates for variations by reconfiguring the synaptic weights. It is statically evaluated how the proposed ADC responds to the DC logarithmic ramp signal.

Figure 10:
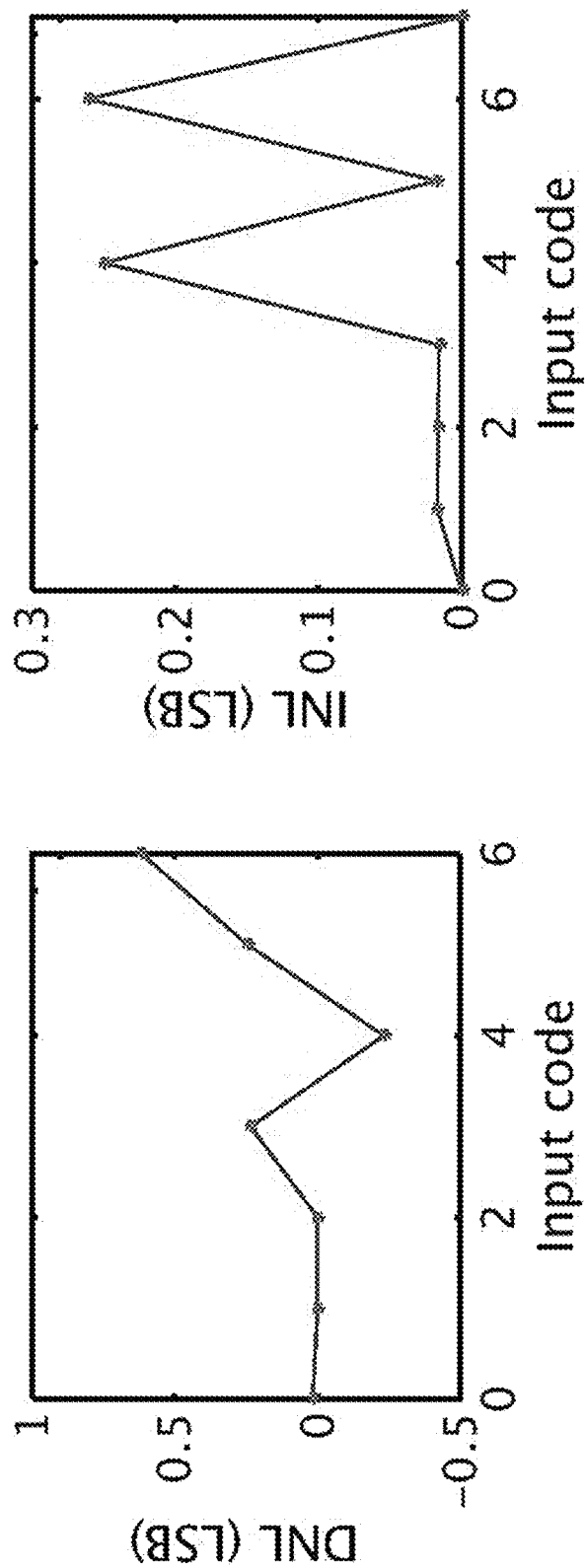
FIG. 10 shows the INL and DNL plots for the logarithmic ADC, according to an embodiment of the present invention.

FIG. 10 shows the INL and DNL plots for the logarithmic ADC. After training, the ADC is almost fully calibrated, monotonic, and accurate: INL≈0.26 LSB, and DNL≈0.62 LSB. It is then dynamically evaluated and analyzed, in response to an exponential sinusoidal input signal with 44 kHz frequency where the harmonic distortions are mitigated, and the SNDR and ENOB improve as the training progresses. The power consumption is also analyzed, as specified, during training until it reaches its minimum when the training is finished. The best energetic state of the network is achieved when it is configured in a logarithmic ADC manner.

The DAC is evaluated using similar methodologies. The proposed networks can also be trained to perform linear ADC/DAC using linearly quantized teaching data-sets. Table VI lists the full performance metrics and comparison with the linear ADC/DAC.

TABLE 6

Log ADC/DAC Performance Evaluation

| Metric | Logarithmic ADC | Linear ADC |
|---|---|---|
| N | 3 bits | 4 bits |
| INL | 0.26 LSB | 0.4 LSB |
| DNL | 0.62 LSB | 0.5 LSB |
| DR | 42.114 dB | 24.08 dB |
| SNDR | 17.1 dB | 24.034 dB |
| ENOB | 2.55 | 3.7 |
| P | 45.18 µW | 100 µW |
| FOM | 77.19 pJ/conv | 0.136 nJ/conv |
| Training time | 20 ms | 40 ms |

| Metric | Logarithmic DAC | Linear DAC |
|---|---|---|
| N | 3 bits | 4 bits |
| INL | 0.163 LSB | 0.12 LSB |
| DNL | 0.122 LSB | 0.11 LSB |
| Training time | 80 ms | 30 ms |

In some embodiments, the present disclosure presents a novel pipelined neural network ADC architecture. This large-scale design was based on coarse-resolution neuromorphic ADC and DAC, modularly cascaded in a high-throughput pipeline and precisely trained online using SGD algorithm for multiple full-scale voltages, and sampling frequencies. The learning algorithm successfully tuned the neural network in non-ideal test conditions and configured the network as an accurate, fast, and low-power ADC. The hybrid CMOS-memristor design with 1.8 V full-scale voltage achieved 0.97 fJ/conv FOM at the maximum conversion rate.

In some embodiments, the present disclosure report also presents a novel logarithmic quantization of an ANN ADC/DAC that is trained online using the SGD algorithm, enabling reconfigurable quantization. A hybrid CMOS-memristor circuit design was presented for the realization of a three-bit neural network ADC/DAC. The learning algorithm successfully adjusted the memristors and reconfigured the ADC/DAC along with the full-scale voltage range, quantization distribution, and sampling frequency. The simulations achieved a 77.19 pJ/conv FOM, exceeding the performance of a linear ADC.

What is claimed is:

1. A pipelined analog-to-digital converter (ADC) system comprising:
   a first ADC stage comprising a trainable neural network layer, wherein said first ADC stage is configured to (i) receive an analog input signal, and (ii) convert it into a first n-bit digital output representing said analog input signal;
   a digital-to-analog converter (DAC) circuit comprising a trainable neural network layer, wherein said DAC circuit is configured to (iii) receive said first n-bit digital output, and (iv) convert it into an analog output signal representing said first n-bit digital output; and
   a second ADC stage comprising a trainable neural network layer, wherein said second ADC stage is configured to (v) receive a residue analog input signal of said analog input signal, and (vi) convert it into a second n-bit digital output representing said residue analog input signal;
   wherein said first and second n-bit digital outputs are combined to generate a combined digital output representing said analog input signal.

2. The system of claim 1, wherein each of said first and second n-bit digital outputs is a 4-bit digital output.

3. The system of claim 1, wherein said residue analog input signal is determined based, at least in part, on a comparison between said analog input signal and said analog output signal.

4. The system of claim 1, further comprising one or more subsequent ADC stages connected in a pipelined arrangement, wherein each of said subsequent ADC stages comprises:
   (i) a DAC circuit comprising a trainable neural network layer, wherein said DAC circuit is configured to receive an n-bit digital output from a preceding ADC stage and convert it into an analog output signal representing said n-bit digital output; and
   (ii) an ADC circuit comprising a trainable neural network layer, wherein said ADC circuit is configured to receive a residue analog input signal of said analog input signal, and convert it into an n-bit digital output representing said residue analog input signal.

5. The system of claim 4, wherein said first n-bit digital output, said second n-bit digital output, and all of said n-bit digital output of said subsequent ADC stages, are combined to generate said combined digital output.

6. The system of claim 1, wherein said combined digital output comprises a number of bits equal to n-bits multiplied by the number of all of said ADC stages.

7. The system of claim 1, wherein said n-bit digital output of a last of said subsequent ADC stages in the pipeline represents a least significant bits (LSB) portion of said combined digital output.

8. The system of claim 1, wherein each of said trainable neural network layers is arranged as a memristive crossbar array comprising a synaptic weightings matrix, and wherein an output vector of each of said trainable neural network layers is calculated as a weighted sum of said outputs of said neurons multiplied by said synaptic weightings matrix.

9. The system of claim 8, wherein, at a training stage of said system, each of said neural network layers is trained by an iterative process comprising:
   (i) comparing said output vector of said neural network layer to a respective training input; and
   (ii) adjusting, based on said comparing, said synaptic weightings matrix of said neural network layer, wherein said adjusting minimizes a cost function based on a gradient descent algorithm.

10. The system of claim 9, wherein, with respect to each of said ADC stages, said training input comprises an n-bit portion of a desired digital output of said system, and wherein said n-bit portion corresponds to bit positions of said n-bit digital output of said ADC stage within said combined digital output.

11. An analog to digital (ADC) conversion method, the method comprising:
   receiving an analog input signal;
   converting said analog input signal, using a first ADC stage comprising a trainable neural network layer, into a first n-bit digital output representing said analog input signal;
   converting said first n-bit digital output, using a digital-to-analog converter (DAC) circuit comprising a trainable neural network layer, into an analog output signal representing said first n-bit digital output; and
   converting a residue analog input signal of said analog input signal, using a second ADC stage comprising a trainable neural network layer, into a second n-bit digital output representing said residue signal; and combining said first and second n-bit digital outputs to generate a combined digital output representing said analog input signal.

12. The method of claim 11, wherein each of said first and second n-bit digital outputs is a 4-bit digital output.

13. The method of claim 11, wherein said residue analog input signal is determined based, at least in part, on a comparison between said analog input signal and said analog output signal.

14. The method of claim 11, further comprising using one or more subsequent ADC stages connected in a pipelined arrangement, wherein said method comprises, with respect to each of said subsequent ADC stages:
   (i) receiving, from a preceding ADC stage, an n-bit digital output;
   (ii) converting said n-bit digital output, using a DAC circuit comprising a trainable neural network layer, into an analog output signal representing said n-bit digital output; and
   (iii) converting a residue analog input signal of said analog input signal, using an ADC circuit comprising a trainable neural network layer, into an n-bit digital output representing said residue signal.

15. The method of claim 14, wherein said first n-bit digital output, said second n-bit digital output, and all of said n-bit digital output of said subsequent ADC stages, are combined to generate said combined digital output.

16. The method of claim 11, wherein said combined digital output comprises a number of bits equal to n-bits multiplied by the number of all said ADC stages.

17. The method of claim 11, wherein said n-bit digital output of a last of said subsequent ADC stages represents a least significant bits (LSB) portion of said combined digital output.

18. The method of claim 11, wherein each of said trainable neural network layers is arranged as a memristive crossbar array comprising a synaptic weightings matrix, and wherein an output vector of each of said trainable neural network layers is calculated as a weighted sum of said outputs of said neurons multiplied by said synaptic weightings matrix.

19. The method of claim 18, wherein, at a training stage, each of said neural network layers is trained by an iterative process comprising:
   (i) comparing said output vector of said neural network layer to a respective training input; and
   (ii) adjusting, based on said comparing, said synaptic weightings matrix of said neural network layer, wherein said adjusting minimizes a cost function based on a gradient descent algorithm.

20. The method of claim 19, wherein, with respect to each of said ADC stages, said training input comprises an n-bit portion of a desired digital output, and wherein said n-bit portion corresponds to bit positions of said n-bit digital output of said ADC stage within said combined digital output.

* * * * *